(12) United States Patent
Yun et al.

(10) Patent No.: US 12,446,315 B2
(45) Date of Patent: Oct. 14, 2025

(54) DISPLAY DEVICE AND MANUFACTURING METHOD THEREOF

(71) Applicant: LG Display Co., Ltd., Seoul (KR)

(72) Inventors: SungJun Yun, Gyeonggi-do (KR); PilSang Yun, Gyeonggi-do (KR); Taegyun Kim, Gyeonggi-do (KR); MinSu Kim, Gyeonggi-do (KR); InTak Cho, Gyeonggi-do (KR); ISak Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 374 days.

(21) Appl. No.: 17/974,430

(22) Filed: Oct. 26, 2022

(65) Prior Publication Data
US 2023/0411409 A1    Dec. 21, 2023

(30) Foreign Application Priority Data
May 25, 2022    (KR) .................. 10-2022-0064273

(51) Int. Cl.
*H10D 86/60*    (2025.01)
*H10D 86/01*    (2025.01)
*H10D 86/40*    (2025.01)

(52) U.S. Cl.
CPC ........... *H10D 86/60* (2025.01); *H10D 86/021* (2025.01); *H10D 86/451* (2025.01); *H10D 86/441* (2025.01)

(58) Field of Classification Search
CPC . H10D 86/40–60; H10D 86/021–0251; H10K 59/125; H01L 21/3143–3145
See application file for complete search history.

(56) References Cited

U.S. PATENT DOCUMENTS

| | | | |
|---|---|---|---|
| 10,373,989 B2 | 8/2019 | Lv et al. | |
| 2009/0159884 A1* | 6/2009 | Oda | H10D 30/6739 |
| | | | 438/151 |
| 2023/0157082 A1* | 5/2023 | Choi | H10K 50/15 |
| | | | 257/40 |

FOREIGN PATENT DOCUMENTS

| | | | | |
|---|---|---|---|---|
| CN | 111554695 A | | 8/2020 | |
| EP | 3896736 A1 | * | 10/2021 | ......... H01L 27/1225 |
| JP | 200773562 A | | 3/2007 | |
| JP | 2007073562 A | * | 3/2007 | |
| KR | 10-2018-0023113 A | | 3/2018 | |
| KR | 10-2020-0023626 A | | 3/2020 | |
| KR | 10-2021-0012391 A | | 2/2021 | |
| KR | 10-2022-0043704 A | | 4/2022 | |

* cited by examiner

*Primary Examiner* — Shahed Ahmed
(74) *Attorney, Agent, or Firm* — Seed Intellectual Property Law Group LLP

(57) ABSTRACT

Disclosed are a display device and a manufacturing method thereof. More particularly, a display device including a substrate, a buffer layer disposed on the substrate, an active layer disposed on the buffer layer, a gate insulating film disposed on the active layer, and a gate electrode disposed on the gate insulating film, wherein the gate insulating film includes a first portion and a second portion, wherein the first portion is closer to the active layer than the second portion and the second portion is closer to the gate electrode than the first portion, and the gate insulating film includes two or more elements having different component concentrations in the first portion and the second portion, and a manufacturing method thereof are provided to provide a transistor structure having high reliability.

20 Claims, 36 Drawing Sheets

DISPLAY DEVICE AND MANUFACTURING METHOD THEREOF

CROSS REFERENCE TO RELATED APPLICATION

This application claims priority from Korean Patent Application No. 10-2022-0064273, filed on May 25, 2022.

BACKGROUND

Technical Field

Embodiments relate to a display device and a manufacturing method thereof.

Description of the Related Art

Transistors are widely used as switching devices or driving devices in electronic apparatus fields.

In particular, a thin-film transistor may be easily manufactured on a glass substrate or a plastic substrate, and thus the thin-film transistor may be used as a driving device or a switching device in a display device such as a liquid crystal display device or an organic light-emitting display device.

BRIEF SUMMARY

A transistor may degrade as the driving time increases. When the transistor degrades, device reliability of the transistor may be reduced. When the device reliability is reduced due to the degradation of the transistor, image quality of the display device may also be reduced.

In a display field, although techniques of various approaches for improving or compensating for degradation of a transistor have been developed, an image quality degradation phenomenon, such as an instantaneous afterimage, occurs. Accordingly, the inventors of the present specification have identified a cause of the image quality degradation phenomenon such as an instantaneous afterimage through long experiments and analysis, and developed a transistor structure capable of improving degradation of the transistor in positive and negative directions and image quality on the basis of the identified cause. A transistor may be said to degrade in a positive direction (PBTS degradation) when the threshold voltage of the transistor increases. Similarly, a transistor may be said to degrade in a negative direction (NBTS degradation) when the threshold voltage of the transistor decreases.

Embodiments provide a display device having a transistor structure capable of improving both degradation of a transistor in positive and negative directions, and a manufacturing method thereof.

Embodiments provide a display device having a transistor structure capable of preventing an instantaneous afterimage, and a manufacturing method thereof.

Embodiments provide a display device including a gate insulating film having a structure capable of removing a trap generated at an interface between an active layer and the gate insulating film, and a manufacturing method thereof.

Embodiments provide a manufacturing method of a display device which can form a gate insulating film having a structure capable of removing a trap generated at an interface between an active layer and the gate insulating film.

A display device according to embodiments includes a substrate, a buffer layer disposed on the substrate, an active layer disposed on the buffer layer, a gate insulating film disposed on the active layer, and a gate electrode disposed on the gate insulating film.

The gate insulating film may include a first portion and a second portion, wherein the first portion may be closer to the active layer than the second portion, and the second portion may be closer to the gate electrode than the first portion. The first portion may be in contact with the active layer. The second portion may be in contact with the gate electrode.

The gate insulating film may include two or more elements having different component concentrations in the first portion and the second portion. The term "component concentration," as used herein, should be understood to encompass both concentration by mass and concentration by volume. In some embodiments, "component concentration" refers to concentration by mass.

The two or more elements may include at least one of hydrogen and oxygen and at least one of silicon and nitrogen.

When hydrogen is included in the two or more elements, a component concentration of the hydrogen in the first portion may be higher than a component concentration of the hydrogen in the second portion.

When silicon is included in the two or more elements, a component concentration of the silicon in the first portion may be higher than a component concentration of the silicon in the second portion.

A display device according to embodiments includes a substrate, a buffer layer disposed on the substrate, an active layer disposed on the buffer layer, a gate insulating film disposed on the active layer, a gate electrode disposed on the gate insulating film, and a protective film disposed between the gate insulating film and the gate electrode.

The gate insulating film and the protective film may commonly include two or more elements having different component concentrations in the gate insulating film and the protective film.

The two or more elements may include at least one of hydrogen and oxygen and at least one of silicon and nitrogen.

A manufacturing method of a display device according to embodiments includes forming an active layer on a substrate, forming a gate insulating film including a first portion and a second portion by depositing an insulating material on the active layer with a deposition gas, and forming a gate electrode on the gate insulating film.

The forming of the gate insulating film may include a first operation of forming the first portion by depositing the insulating material (directly) on the active layer with the deposition gas having a first flow rate, and a second operation of forming the second portion by depositing the insulating material on the first portion with the deposition gas having a second flow rate lower than the first flow rate.

The first operation may be performed for a shorter time than the second operation.

A thickness of the first portion of the gate insulating film formed in the first operation may increase as a time in which the first operation is performed (i.e., a duration of the first operation) increases.

The thickness of the first portion may be less than a thickness of the second portion.

The first portion may be closer to the active layer than the second portion, the second portion may be closer to the gate electrode than the first portion, and the gate insulating film may include two or more elements having different component concentrations in the first portion and the second portion.

The two or more elements may include at least one of hydrogen and oxygen and at least one of silicon and nitrogen.

The deposition gas may include silane ($SiH_4$).

According to embodiments, it is possible to provide a display device having a transistor structure which can improve both degradations of a transistor in positive and negative directions, and a manufacturing method thereof.

According to embodiments, it is possible to provide a display device having a transistor structure which can prevent an instantaneous afterimage, and a manufacturing method thereof.

According to embodiments, it is possible to provide a display device including a gate insulating film having a structure which can remove a trap generated at an interface between an active layer and the gate insulating film, and a manufacturing method thereof.

BRIEF DESCRIPTION OF THE SEVERAL VIEWS OF THE DRAWINGS

The above and other aspects, features, and advantages of the present disclosure will be more apparent from the following detailed description taken in conjunction with the accompanying drawings, in which.

DETAILED DESCRIPTION

Figure 1:
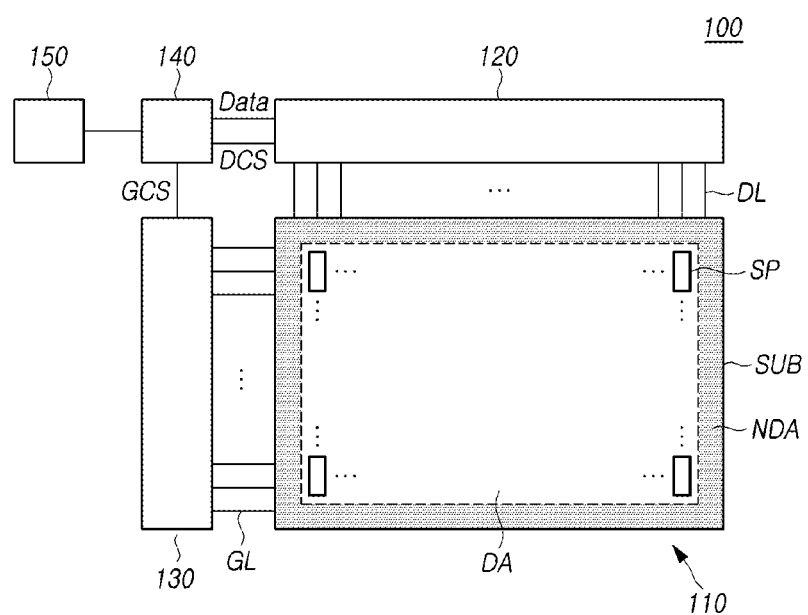
FIG. 1 is a system configuration diagram of a display device according to embodiments.

In the following description of examples or embodiments, reference will be made to the accompanying drawings in which specific examples or embodiments that can be implemented are shown by way of illustration, and in which the same reference numerals and signs can be used to designate the same or like components even when they are shown in different accompanying drawings from one another. Further, in the following description of examples or embodiments, detailed descriptions of well-known functions and components incorporated herein will be omitted when it is determined that the description may make the subject matter in some embodiments rather unclear. The terms such as "including," "having," "containing," "constituting" "make up of" and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements, etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

Hereinafter, various embodiments will be described in detail with reference to the accompanying drawings.

FIG. 1 is a system configuration diagram of a display device 100 according to embodiments.

Referring to FIG. 1, the display device 100 according to embodiments may include a display panel 110 and a driving circuit for driving the display panel 110.

The driving circuit may include a data driving circuit 120, a gate driving circuit 130, and the like, and may further include a controller 140 that controls the data driving circuit 120 and the gate driving circuit 130.

The display panel 110 may include a substrate SUB and signal lines such as a plurality of data lines DL and a plurality of gate lines GL disposed on the substrate SUB. The display panel 110 may include a plurality of sub-pixels SP connected to the plurality of data lines DL and the plurality of gate lines GL.

The display panel 110 may include a display area DA in which an image is displayed and a non-display area NDA in which an image is not displayed and which is located around the display area DA. In the display panel 110, the plurality of sub-pixels SP for displaying an image may be disposed in the display area DA, and in the non-display area NDA, the driving circuits 120, 130, and 140 may be electrically connected or the driving circuits 120, 130, and 140 may be mounted, and a pad part to which an integrated circuit, a printed circuit, or the like is connected may be disposed.

The data driving circuit 120 is a circuit for driving the plurality of data lines DL and may supply data signals to the plurality of data lines DL. The gate driving circuit 130 is a circuit for driving the plurality of gate lines GL, and may supply gate signals to the plurality of gate lines GL. The controller 140 may supply a data control signal DCS to the data driving circuit 120 in order to control an operation timing of the data driving circuit 120. The controller 140 may supply a gate control signal GCS for controlling an operation timing of the gate driving circuit 130 to the gate driving circuit 130.

The controller 140 may control such that a scanning operation starts according to a timing implemented in each frame, convert input image data, which is input from the outside, according to a data signal format used by the data driving circuit 120 and supply image data Data, which is converted data, to the data driving circuit 120, and control such that data driving is performed at an appropriate time according to a scanning timing.

In order to control the gate driving circuit 130, the controller 140 may output various types of gate control signals GCS including a gate start pulse GSP, a gate shift clock GSC, a gate output enable signal GOE, and the like.

In order to control the data driving circuit 120, the controller 140 may output various types of data control signals DCS including a source start pulse SSP, a source sampling clock SSC, a source output enable signal SOE, and the like.

The controller 140 may be implemented as a separate component from the data driving circuit 120 or implemented as an integrated circuit by being integrated with the data driving circuit 120.

The data driving circuit 120 receives the image data from the controller 140 and supplies a data voltage to the plurality of data lines DL to drive the plurality of data lines DL. Here, the data driving circuit 120 is also referred to as a source driving circuit.

The data driving circuit 120 may include one or more source driver integrated circuits (SDIC).

For example, each SDIC may be connected to the display panel 110 by a tape-automated bonding (TAB) method, may be connected to a bonding pad of the display panel 110 by a chip-on-glass (COG) method or a chip-on-panel (COP) method, or may be connected to the display panel 110 by a chip-on-film (COF) method.

The gate driving circuit 130 may output a gate signal of a turn-on level voltage or a gate signal of a turn-off level voltage under the control of the controller 140. The gate driving circuit 130 may sequentially drive the plurality of gate lines GL by sequentially supplying the gate signal of the turn-on level voltage to the plurality of gate lines GL.

The gate driving circuit 130 may be connected to the display panel 110 by a TAB method, may be connected to the bonding pad of the display panel 110 by a COG method or a COP method, or may be connected to the display panel 110 by a COF method. Alternatively, the gate driving circuit 130 may be formed in the non-display area NDA of the display panel 110 in a gate-in-panel (GIP) type. The gate driving circuit 130 may be disposed on the substrate SUB or may be connected to the substrate SUB. That is, in a case in which the gate driving circuit 130 is a GIP type, the gate driving circuit 130 may be disposed in the non-display area NDA of the substrate SUB. In a case in which the gate driving circuit 130 is a COG type, a COF type, or the like, the gate driving circuit 130 may be connected to the substrate SUB.

Meanwhile, at least one of the data driving circuit 120 and the gate driving circuit 130 may be disposed in the display area DA. For example, at least one of the data driving circuit 120 and the gate driving circuit 130 may be disposed not to overlap the sub-pixels SP, or may also be disposed to partially or entirely overlap the sub-pixels SP.

When a specific gate line GL is opened by the gate driving circuit 130, the data driving circuit 120 may convert the image data Data, which is received from the controller 140, into an analog-type data voltage and supply the converted analog-type data voltage to the plurality of data lines DL.

The data driving circuit 120 may be connected to one side (e.g., an upper side or a lower side) of the display panel 110. Depending on a driving method, a panel design method, or the like, the data driving circuit 120 may be connected to both sides (e.g., the upper side and the lower side) of the display panel 110 or may also be connected to two or more side surfaces of four side surfaces of the display panel 110.

The gate driving circuit 130 may be connected to one side (e.g., a left side or a right side) of the display panel 110. Depending on a driving method, a panel design method, or the like, the gate driving circuit 130 may be connected to both sides (e.g., the left side and the right side) of the display panel 110 or may also be connected to two or more side surfaces of the four side surfaces of the display panel 110.

The controller 140 may be a timing controller used in a conventional display technique or a control device that may further perform other control functions in addition to the function of the timing controller, may be a control device different from the timing controller, or may be a circuit in the control device. The controller 140 may be implemented as various circuits or electronic components, such as integrated circuits (ICs), field-programmable gate arrays (FPGAs), application-specific integrated circuits (ASICs), processors, or the like.

The controller 140 may be mounted on a printed circuit board, a flexible printed circuit board, or the like, and may be electrically connected to the data driving circuit 120 and the gate driving circuit 130 through the printed circuit board, the flexible printed circuit board, or the like.

The display device 100 according to embodiments may be a display including a backlight unit such as a liquid-crystal display device, and may be a self-emissive display such as an organic light-emitting diode (OLED) display, a quantum dot display, or a micro light-emitting diode (LED) display.

When the display device 100 according to embodiments is an OLED display, each of the sub-pixels SP may include an OLED, which emits light by itself (when a current is applied therethrough), as a light-emitting device. When the display device 100 according to embodiments is a quantum dot display, each of the sub-pixels SP may include a light-emitting device made of a quantum dot, which is a semiconductor crystal that emits light by itself (when a current is applied therethrough). When the display device 100 according to embodiments is a micro LED display, each of the sub-pixels SP may include a micro LED, which emits light by itself (when a current is applied therethrough) and is made based on an inorganic material, as a light-emitting device.

Figure 2:
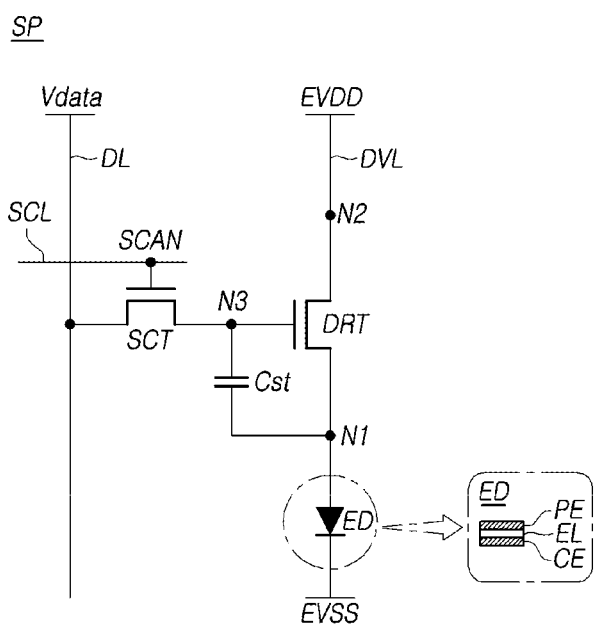
FIG. 2 is an equivalent circuit diagram of a sub-pixel of the display device according to embodiments.
Figure 3:
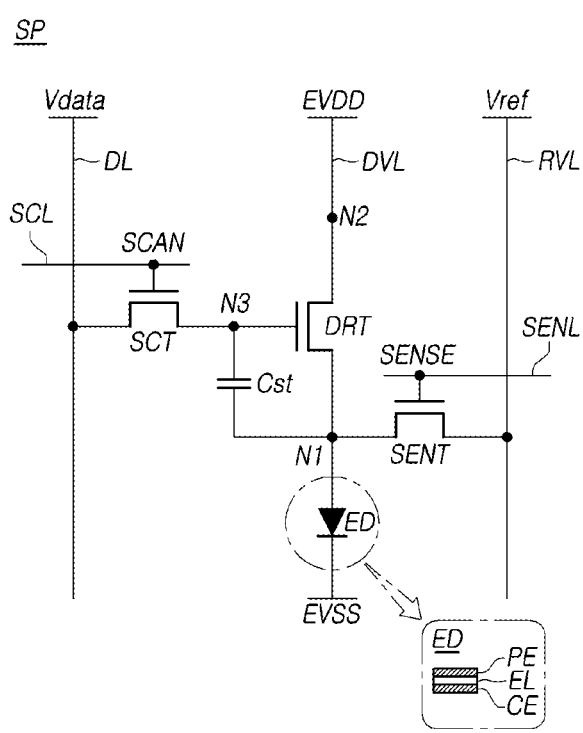
FIG. 3 is another equivalent circuit diagram of the sub-pixel of the display device according to embodiments.

FIG. 2 is an equivalent circuit diagram of the sub-pixel SP of the display device 100 according to embodiments, and FIG. 3 is another equivalent circuit diagram of the sub-pixel SP of the display device 100 according to embodiments.

Referring to FIG. 2, each of the plurality of sub-pixels SP disposed in the display panel 110 of the display device 100 according to embodiments may include a light-emitting device ED, a driving transistor DRT, a scanning transistor SCT, and a storage capacitor Cst.

Referring to FIG. 2, the light-emitting device ED may include a pixel electrode PE, a common electrode CE, and a light-emitting layer EL located between the pixel electrode PE and the common electrode CE.

The pixel electrode PE of the light-emitting device ED may be an electrode disposed for each sub-pixel SP, and the common electrode CE may be an electrode commonly disposed in all sub-pixels SP. Here, the pixel electrode PE may be an anode and the common electrode CE may be a cathode which is supplied with a low-potential power voltage EVSS. In contrast, the pixel electrode PE may be a cathode and the common electrode CE may be an anode.

For example, the light-emitting device ED may be an OLED, an LED, a quantum dot light-emitting device, or the like.

The driving transistor DRT is a transistor for driving the light-emitting device ED, and may include a first node N1, a second node N2, a third node N3, and the like.

The first node N1 of the driving transistor DRT may be a source node (source electrode) or a drain node (drain electrode) of the driving transistor DRT, and may be electrically connected to the pixel electrode PE of the light-emitting device ED. The second node N2 of the driving transistor DRT may be the drain node (drain electrode) or the source node (source electrode) of the driving transistor DRT, and may be electrically connected to a driving voltage line DVL through which a driving voltage EVDD is supplied. The third node N3 of the driving transistor DRT may be a gate node (gate electrode) of the driving transistor DRT and may be electrically connected to a source node or a drain node of the scanning transistor SCT.

The scanning transistor SCT may be controlled by a scanning gate signal SCAN, which is a type of gate signal, and may be connected between the third node N3 of the driving transistor DRT and the data line DL. In other words, the scanning transistor SCT may be turned on or off according to the scanning gate signal SCAN supplied through a scanning gate line SCL, which is a type of the gate line GL, and may control a connection between the data line DL and the third node N3 of the driving transistor DRT.

The scanning transistor SCT may be turned on by the scanning gate signal SCAN having the turn-on level voltage, and may transmit a data voltage Vdata, which is supplied through the data line DL, to the third node N3 of the driving transistor DRT.

Here, when the scanning transistor SCT is an n-type transistor, the turn-on level voltage of the scanning gate signal SCAN may be a high-level voltage. When the scanning transistor SCT is a p-type transistor, the turn-on level voltage of the scanning gate signal SCAN may be a low-level voltage.

The storage capacitor Cst may be connected between the third node N3 and the first node N1 of the driving transistor DRT. The storage capacitor Cst is charged with an amount of electric charge corresponding to a voltage difference between both ends thereof and serves to maintain the voltage difference between both ends thereof during a predetermined frame time. Accordingly, light may be emitted from the corresponding sub-pixel SP during the predetermined frame time.

Referring to FIG. 3, each of the plurality of sub-pixels SP disposed in the display panel 110 of the display device 100 according to embodiments may further include a sensing transistor SENT.

The sensing transistor SENT may be controlled by a sensing gate signal SENSE, which is a type of gate signal, and may be connected between the first node N1 of the driving transistor DRT and a reference voltage line RVL. In other words, the sensing transistor SENT may be turned on or off according to the sensing gate signal SENSE supplied through a sensing gate line SENL, which is another type of the gate line GL, and may control a connection between the reference voltage line RVL and the first node N1 of the driving transistor DRT.

The sensing transistor SENT may be turned on by the sensing gate signal SENSE having the turn-on level voltage, and may transmit a reference voltage Vref, which is supplied through the reference voltage line RVL, to the first node N1 of the driving transistor DRT.

Further, the sensing transistor SENT may be turned on by the sensing gate signal SENSE having the turn-on level voltage and may transmit a voltage at the first node N1 of the driving transistor DRT to the reference voltage line RVL.

Here, when the sensing transistor SENT is an n-type transistor, the turn-on level voltage of the sensing gate signal SENSE may be a high-level voltage. When the sensing transistor SENT is a p-type transistor, the turn-on level voltage of the sensing gate signal SENSE may be a low-level voltage.

The function of the sensing transistor SENT that transmits the voltage at the first node N1 of the driving transistor DRT to the reference voltage line RVL may be used when driven to sense a characteristic value of the sub-pixel SP. In this case, the voltage transmitted to the reference voltage line RVL may be a voltage for calculating the characteristic value of the sub-pixel SP or a voltage in which the characteristic value of the sub-pixel SP is reflected.

Each of the driving transistor DRT, the scanning transistor SCT, and the sensing transistor SENT may be an n-type transistor or a p-type transistor. In the present disclosure, for convenience of description, it is assumed that each of the driving transistor DRT, the scanning transistor SCT, and the sensing transistor SENT is the n-type transistor.

The storage capacitor Cst may be an external capacitor intentionally designed to be located outside the driving transistor DRT, rather than a parasitic capacitor (e.g., Cgs or Cgd), which is an internal capacitor that is present between the gate node and the source node (or drain node) of the driving transistor DRT.

The scanning gate line SCL and the sensing gate line SENL may be different gate lines GL. In this case, the scanning gate signal SCAN and the sensing gate signal SENSE may be separate gate signals, and an on-off timing of the scanning transistor SCT and an on-off timing of the sensing transistor SENT in one sub-pixel SP may be independent. That is, the on-off timing of the scanning transistor SCT and the on-off timing of the sensing transistor SENT in one sub-pixel SP may be the same as or different from each other.

Alternatively, the scanning gate line SCL and the sensing gate line SENL may be the same gate line GL. That is, a gate node of the scanning transistor SCT and a gate node of the sensing transistor SENT in one sub-pixel SP may be connected to one gate line GL. In this case, the scanning gate signal SCAN and the sensing gate signal SENSE may be the same gate signal, and the on-off timing of the scanning transistor SCT and the on-off timing of the sensing transistor SENT in one sub-pixel SP may be the same.

The structures of the sub-pixel SP shown in FIGS. 2 and 3 are merely examples and may be variously modified to further include one or more transistors or further include one or more capacitors.

Further, in FIGS. 2 and 3, the structures of the sub-pixels have been described on the assumption that the display device 100 is a self-emissive display device, but when the display device 100 is a liquid crystal display device, each sub-pixel SP may include a transistor, a pixel electrode, and the like.

Figure 4:
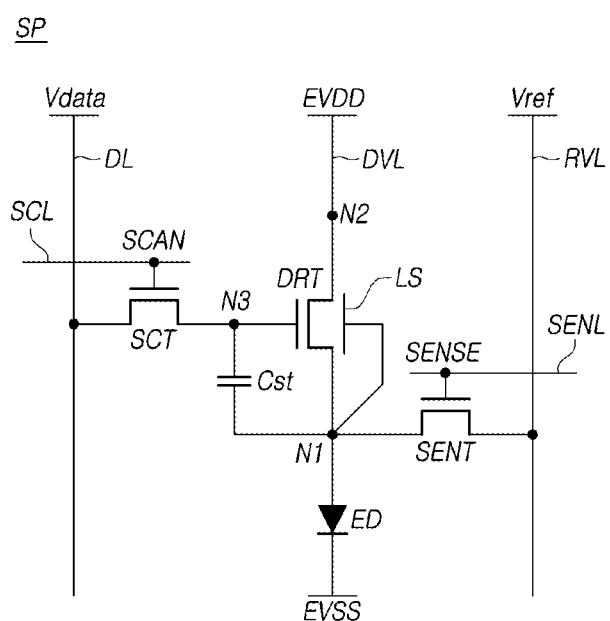
FIG. 4 is a view illustrating a light shield in the sub-pixel of the display device according to embodiments.

FIG. 4 is a view illustrating a light shield LS in the sub-pixel SP of the display device 100 according to embodiments.

Referring to FIG. 4, in the sub-pixel SP of the display device 100 according to embodiments, the driving transistor DRT may have an intrinsic characteristic value such as a threshold voltage, mobility, or the like. When the intrinsic characteristic value of the driving transistor DRT is changed, a current driving capability (current supply performance) of the driving transistor DRT may be changed so that light emission characteristics of the corresponding sub-pixel SP may also be changed.

Device characteristics (e.g., a threshold voltage, mobility, or the like) of the driving transistor DRT may be changed as a driving time of the driving transistor DRT elapses. In addition, when light is irradiated onto the driving transistor DRT, for example, when light is irradiated onto a channel area of the driving transistor DRT, the device characteristics (e.g., a threshold voltage, mobility, or the like) of the driving transistor DRT may be changed.

Accordingly, as shown in FIG. 4, the light shield LS may be formed in the vicinity of the driving transistor DRT to reduce a change (e.g., a threshold voltage change, a mobility change, or the like) in the device characteristics of the driving transistor DRT. For example, the light shield LS may be formed below the channel area of the driving transistor DRT.

Meanwhile, the light shield LS may be formed below the channel area of the driving transistor DRT and may serve as a body of the driving transistor DRT, in addition to serving to block light.

A body effect may occur in the driving transistor DRT, and the light shield LS serving as a body of the driving transistor DRT may be electrically connected to the first node N1 of the driving transistor DRT in order to reduce the influence of the body effect. Here, the first node N1 of the driving transistor DRT may be the source node of the driving transistor DRT.

Meanwhile, the light shield LS may be disposed not only below the channel area of the driving transistor DRT but also below a channel area of another transistor (e.g., the SCT or the SENT).

In the display area DA of the display panel 110 according to embodiments, the transistors DRT, SCT, and SENT may be disposed for each of the sub-pixels SP. When the gate driving circuit 130 is formed in a GIP type in the non-display area NDA of the display panel 110 according to embodiments, a plurality of transistors included in the gate driving circuit 130 of the GIP type may be disposed in the non-display area NDA of the display panel 110.

As described above, a plurality of transistors may be disposed in the display panel 110 according to embodiments. Such transistors (for example, the driving transistor DRT in each sub-pixel SP) may degrade as a driving time elapses.

The degradation that may occur in a transistor may include degradation due to PBTS (hereinafter referred to as positive bias temperature stress (PBTS) degradation, positive degradation, or degradation in a positive direction) and degradation due to NBTS (hereinafter referred to as negative bias temperature stress (NBTS) degradation, negative degradation, or degradation in a negative direction). Hereinafter, degradation including both the positive degradation and the negative degradation is referred to as bidirectional degradation.

Meanwhile, an instantaneous afterimage may occur in a conventional display device during driving. For example, the instantaneous afterimages may occur in a portion in which a grayscale is rapidly changed when a screen is switched.

The inventors of the present specification have confirmed that the instantaneous afterimage is related to degradation of a transistor through experiments and analysis and have invented a structure and a process method which can improve the degradation of the transistor. For example, the inventors of the present specification have confirmed that the instantaneous afterimage is related to bidirectional degradation of the transistor, and have invented the structure and the process method which can improve all the bidirectional degradation. An improvement in the degradation of a transistor should be understood to be a reduction in the amount or effects of degradation.

Hereinafter, the display device 100, which allows an instantaneous afterimage to be prevented from occurring, even in a driving condition or driving environment in which the instantaneous afterimage may occur, and bidirectional degradation of the transistor to be improved, and a manufacturing method thereof will be described in detail.

Figure 5:
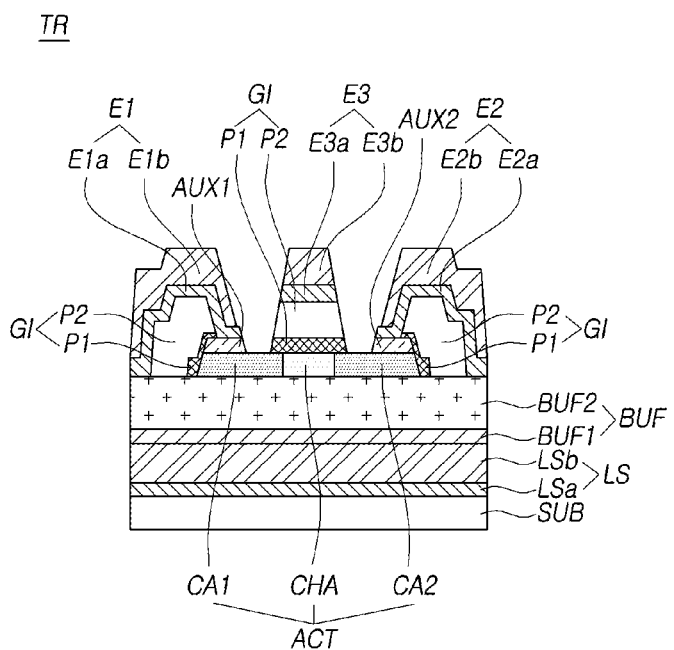
FIGS. 5 and 6 are cross-sectional views each illustrating a transistor structure according to embodiments.
Figure 6:
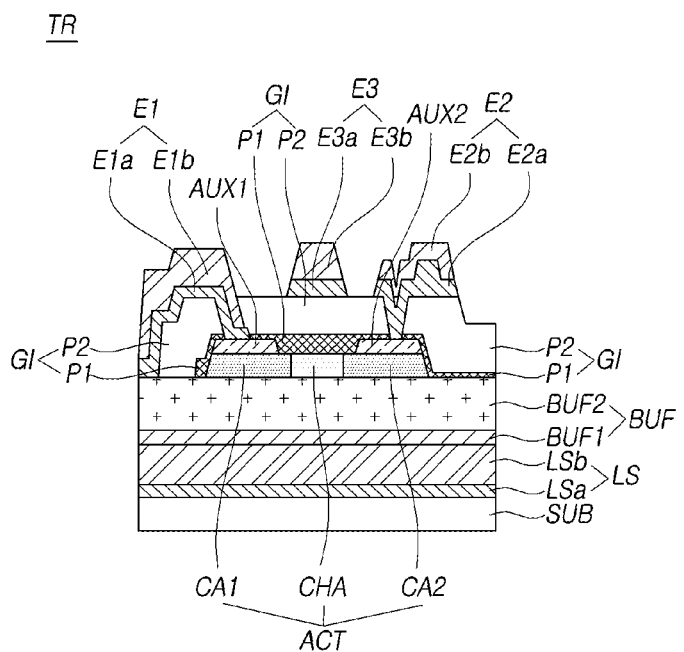

FIGS. 5 and 6 are cross-sectional views each illustrating a transistor structure according to embodiments.

A display panel 110 according to embodiments may include a display area DA, in which an image is displayed, and a non-display area NDA different from the display area DA, and a plurality of transistors TR and a plurality of capacitors may be disposed in the display area DA and/or the non-display area NDA.

The transistors TR disposed on the display panel 110 according to embodiments may be any of transistors DRT, SCT, and SENT disposed in each sub-pixel SP in the display area DA. In some embodiments, the transistor TR may be a driving transistor DRT in each sub-pixel SP in the display area DA, but embodiments are not limited thereto.

For example, the transistor TR disposed on the display panel 110 according to embodiments may be a transistor included in a gate driving circuit 130 of a GIP type, which is formed in the non-display area NDA.

Further, the capacitor disposed on the display panel 110 according to embodiments may be a storage capacitor Cst included in each sub-pixel SP in the display area DA or may be a capacitor included in the gate driving circuit 130 of a GIP type, which is formed in the non-display area NDA.

In the following description, for convenience of description, a case in which the transistor TR is a thin-film transistor (TFT) and is the driving transistor DRT, and the capacitor is the storage capacitor Cst will be described as an example.

Referring to FIGS. 5 and 6, the display panel 110 of the display device 100 according to embodiments may include a substrate SUB, a buffer layer BUF disposed on the substrate SUB, an active layer ACT disposed on the buffer layer BUF, a gate insulating film GI disposed on the active layer ACT, and a gate electrode E3 disposed on the gate insulating film GI, and may further include a light shield LS disposed below the active layer ACT. Hereinafter, the gate electrode E3 is also referred to as a third electrode E3.

The transistor TR disposed on the display panel 110 according to embodiments may include a first electrode E1, a second electrode E2, the third electrode E3, the active layer ACT, and the like. Here, the first electrode E1 may be a source electrode of the transistor TR and the second electrode E2 may be a drain electrode of the transistor TR. Alternatively, the first electrode E1 may be the drain electrode of the transistor TR and the second electrode E2 may be the source electrode of the transistor TR.

The active layer ACT may include a channel area CHA overlapping the third electrode E3, a first conductive area CA1 located to one side of the channel area CHA, and a second conductive area CA2 located to the other side of the channel area CHA.

The active layer ACT may include an oxide semiconductor material. The oxide semiconductor material may be a semiconductor material in which conductivity is controlled and a band gap is adjusted by performing doping on an oxide material and in general, the oxide semiconductor material may be a transparent semiconductor material having a wide bandgap. For example, the oxide semiconductor material may include indium gallium zinc oxide (IGZO), indium gallium zinc tin oxide (IGZTO), zinc oxide (ZnO), cadmium oxide (CdO), indium oxide (InO), zinc tin oxide (ZTO), zinc indium tin oxide (ZITO), and the like. When the active layer ACT includes an oxide semiconductor material, the transistor TR is referred to as an oxide thin-film transistor. The active layer ACT may include a single layer or multiple layers. For example, when the active layer ACT includes multiple layers, the multiple layers may be formed of the same semiconductor material or each of the multiple layers may be formed of two or more different semiconductor materials. If the active layer ACT includes multiple layers, then damage from etching (e.g., etching of layers deposited over the active layer) may be prevented during manufacturing.

The third electrode E3 may be located to be spaced apart from the active layer ACT and may overlap the channel area CHA of the active layer ACT.

The first electrode E1 may be electrically connected to the first conductive area CA1 of the active layer ACT. The second electrode E2 may be electrically connected to the second conductive area CA2 of the active layer ACT.

Each of the first electrode E1, the second electrode E2, and the third electrode E3 may include a single layer or multiple layers. For example, each of the first electrode E1, the second electrode E2, and the third electrode E3 may include copper (Cu), aluminum (Al), molybdenum (Mo), titanium (Ti), molybdenum-titanium (MoTi), or the like. By comprising any of the first electrode E1, the second electrode E2, and the third electrode E3 of multiple layers, the resistance across the electrode can be reduced.

When at least one of the first electrode E1, the second electrode E2, and the third electrode E3 include multiple layers, at least one of the first electrode E1, the second electrode E2, and the third electrode E3 may include a lower electrode (also called "a first material electrode layer") including a first material and an upper electrode (also called "a second material electrode layer") including a second material different from the first material. For example, the first material may include molybdenum (Mo), titanium (Ti), molybdenum-titanium (MoTi), or the like. The second material may include copper (Cu), aluminum (Al), or the like. Hereinafter, a case in which the first material is molybdenum-titanium (MoTi) and the second material is copper (Cu) will be described as an example.

Referring to FIGS. 5 and 6, the first electrode E1 may include a first lower electrode E1a and a first upper electrode E1b that are electrically connected to each other. The first lower electrode E1a may include the first material (e.g., MoTi), and the first upper electrode E1b may include the second material (e.g., Cu) that is different from the first material.

Referring to FIGS. 5 and 6, the second electrode E2 may include a second lower electrode E2a and a second upper electrode E2b that are electrically connected to each other. The second lower electrode E2a may include the first material (e.g., MoTi), and the second upper electrode E2b may include the second material (e.g., Cu) that is different from the first material.

Referring to FIGS. 5 and 6, the third electrode E3 may include a third lower electrode E3a and a third upper electrode E3b that are electrically connected to each other. The third lower electrode E3a may include the first material (e.g., MoTi), and the third upper electrode E3b may include the second material (e.g., Cu) that is different from the first material.

Referring to FIGS. 5 and 6, the transistor TR disposed on the display panel 110 according to embodiments may further include a first auxiliary electrode AUX1 disposed between the first conductive area CA1 and the first electrode E1, and a second auxiliary electrode AUX2 disposed between the second conductive area CA2 and the second electrode E2.

Each of the first auxiliary electrode AUX1 and the second auxiliary electrode AUX2 may include a metal included in the first electrode E1, the second electrode E2, or the third electrode E3, or may include a conductive oxide.

As an example, each of the first auxiliary electrode AUX1 and the second auxiliary electrode AUX2 may include a metal included in the first electrode E1, the second electrode E2, or the third electrode E3. For example, the metal included in the first electrode E1, the second electrode E2, or the third electrode E3 may be copper (Cu), aluminum (Al), molybdenum (Mo), titanium (Ti), molybdenum-titanium (MoTi), or the like.

As another example, each of the first auxiliary electrode AUX1 and the second auxiliary electrode AUX2 may include a conductive oxide that is a conductive material including oxygen.

For example, the conductive oxide may include at least one of a transparent conductive oxide (TCO), a nitric oxide, an organic material, and the like. For example, the transparent conductive oxide (TCO) may include one or more of indium zinc oxide (IZO), indium tin oxide (ITO), indium gallium zinc oxide (IGZO), indium gallium zinc tin oxide (IGZTO), zinc oxide (ZnO), aluminum-doped zinc oxide (AZO), gallium-doped zinc oxide (GZO), antimony tin oxide (ATO), fluorine-doped tin oxide (FTO), and the like. The nitric oxide may include zinc oxynitride (ZnON) or the like.

Referring to FIGS. 5 and 6, the buffer layer BUF may include a single layer or multiple layers. For example, the buffer layer BUF may include various insulating film materials such as silicon nitride ($SiN_x$), silicon dioxide ($SiO_2$), and the like.

Referring to FIGS. 5 and 6, when the buffer layer BUF include multiple layers, the buffer layer BUF may include a first buffer layer BUF1 and a second buffer layer BUF2. In this case, for example, the first buffer layer BUF1 may be silicon nitride ($SiN_x$), and the second buffer layer BUF2 may be silicon dioxide ($SiO_2$).

As shown in FIG. 5, the transistor TR disposed on the display panel 110 according to embodiments may have a gate insulating film etch (GI etch) structure. In this case, the gate insulating film GI may not be disposed between the first electrode E1 and the third electrode E3.

Referring to FIG. 5, the first auxiliary electrode AUX1 may be located on the entire or part of the first conductive area CA1 of the active layer ACT. The entire or part of the first auxiliary electrode AUX1 may be exposed through an opening (etching hole) of the gate insulating film GI. The first electrode E1 may be connected to the first auxiliary electrode AUX1 exposed through the opening (etching hole) of the gate insulating film GI. Thus, the first electrode E1 may be electrically connected to the first conductive area CA1 of the active layer ACT through the first auxiliary electrode AUX1.

The second auxiliary electrode AUX2 may be located on the entire or part of the second conductive area CA2 of the active layer ACT. The entire or part of the second auxiliary electrode AUX2 may be exposed through another opening (etching hole) of the gate insulating film GI. The second electrode E2 may be connected to the second auxiliary electrode AUX2 exposed through the opening (etching hole) of the gate insulating film GI. Thus, the second electrode E2 may be electrically connected to the second conductive area CA2 of the active layer ACT through the second auxiliary electrode AUX2.

As shown in FIG. 6, the transistor TR disposed on the display panel 110 according to embodiments may have a gate insulating film etchless (GI etchless) structure. In this case, the gate insulating film GI may be disposed between the first electrode E1 and the third electrode E3.

Referring to FIG. 6, the first auxiliary electrode AUX1 may be located on the entire or part of the first conductive area CA1 of the active layer ACT. The first electrode E1 may be connected to the first auxiliary electrode AUX1 located on the first conductive area CA1 of the active layer ACT through a contact hole of the gate insulating film GI. Thus, the first electrode E1 may be electrically connected to the first conductive area CA1 of the active layer ACT through the first auxiliary electrode AUX1.

The second auxiliary electrode AUX2 may be located on the entire or part of the second conductive area CA2 of the active layer ACT. The second electrode E2 may be connected to the second auxiliary electrode AUX2 located on the second conductive area CA2 of the active layer ACT through a contact hole of the gate insulating film GI. Thus, the second electrode E2 may be electrically connected to the second conductive area CA2 of the active layer ACT through the second auxiliary electrode AUX2.

Referring to FIG. 5, in the display panel 110 of the display device 100 according to embodiments, the light shield LS may be located between the substrate SUB and the buffer layer BUF and overlap the active layer ACT.

The light shield LS may include a single layer or multiple layers. For example, the light shield LS may include copper (Cu), aluminum (Al), molybdenum (Mo), titanium (Ti), molybdenum-titanium (MoTi), or the like.

Referring to FIGS. 5 and 6, when the light shield LS is a multi-layer, the light shield LS may include a lower light shield LSa including a first material and an upper light shield LSb including a second material different from the first material. For example, the first material may include molybdenum (Mo), titanium (Ti), molybdenum-titanium (MoTi), or the like. The second material may include copper (Cu), aluminum (Al), or the like.

The lower light shield LSa and the upper light shield LSb included in the light shield LS may be electrically connected to or disconnected from each other.

Referring to FIGS. 5 and 6, in the display panel 110 of the display device 100 according to embodiments, the gate insulating film GI may include a first portion P1 and a second portion P2. The second portion may be disposed on the first portion.

Referring to FIGS. 5 and 6, in the display panel 110 of the display device 100 according to embodiments, the first portion P1 of the gate insulating film GI may be closer to the active layer ACT than the second portion P2 of the gate insulating film GI, and the second portion P2 of the gate insulating film GI may be closer to the third electrode E3 than the first portion P1 of the gate insulating film GI.

Referring to FIGS. 5 and 6, in the display panel 110 of the display device 100 according to embodiments, a thickness of the first portion P1 of the gate insulating film GI may be less than a thickness of the second portion P2 of the gate insulating film GI.

For example, the thickness of the first portion P1 may be included in the range of 20 to 300 Å, in some embodiments 25 to 280 Å, in some embodiments 30 to 270 Å, or in some embodiments 34 to 265 Å. If the thickness of the first portion P1 is included in these ranges, it is possible to obtain the effect of preventing the generation of an instantaneous afterimage and improving both the deterioration of the transistor in both directions.

However, when the thickness of the first portion P1 is in the range of 96 to 265 Å, a negative change with respect to the threshold voltage of the transistor may be induced. Therefore, when suppression of the negative change of the threshold voltage of the transistor is more strongly required, the thickness of the first portion P1 may in some embodiments be included in the range of 20 to 100 Å, in some embodiments 25 to 96 Å, in some embodiments 30 to 96 Å, or in some embodiments 34 to 95 Å.

Referring to FIGS. 5 and 6, in the display panel 110 of the display device 100 according to embodiments, the gate insulating film GI may include two or more elements (hereinafter, referred to as specific elements) having different component concentrations in the first portion P1 and the second portion P2.

The two or more specific elements may be commonly included in the first portion P1 of the gate insulating film GI and the second portion P2 of the gate insulating film GI.

The two or more specific elements are elements having different component concentrations in the first portion P1 of the gate insulating film GI and the second portion P2 of the gate insulating film GI. That is, the component concentration of the specific element in the first portion P1 of the gate insulating film GI and the component concentration of the specific element in the second portion P2 of the gate insulating film GI may be different from each other.

For example, the component concentration of the specific element is information indicating an amount of the specific element contained in the gate insulating film GI, and may include an atomic percent, an atomic ratio, or the like.

For example, the two or more specific elements may include at least one first element of hydrogen (H) and oxygen (O), and at least one second element of silicon (Si) and nitrogen (N).

The two or more specific elements should include at least one first element and at least one second element, and the first element and the second element may be elements that perform different roles.

For example, degradation that may occur in the transistor TR may include degradation (hereinafter referred to as PBTS degradation or positive degradation) due to PBTS and degradation (hereinafter referred to as NBTS degradation or negative degradation) due to NBTS. The first element may be an element related to the positive degradation or an improvement on the positive degradation, and the second element may be an element related to the negative degradation or an improvement on the negative degradation.

Hydrogen (H) may be included as the first element in the two or more specific elements. In this case, a component concentration of the hydrogen (H) in the first portion P1 of the gate insulating film GI may be higher than that of the hydrogen (H) in the second portion P2 of the gate insulating film GI. Here, when the component concentration of the hydrogen (H) increases, the positive degradation may be improved.

Oxygen (O) may be included as the first element in the two or more specific elements. In this case, a component concentration of the oxygen (O) in the first portion P1 of the gate insulating film GI may be lower than that of the oxygen (O) in the second portion P2 of the gate insulating film GI. Here, when the component concentration of the oxygen (O) decreases, the positive degradation may be improved.

Silicon (Si) may be included as the second element in the two or more specific elements. In this case, a component concentration of the silicon (Si) in the first portion P1 of the gate insulating film GI may be higher than that of the silicon (Si) in the second portion P2 of the gate insulating film GI. Here, when the component concentration of the silicon (Si) increases, the negative degradation may be improved.

Nitrogen (N) may be included as the second element in the two or more specific elements. In this case, a component concentration of the nitrogen (N) in the first portion P1 of the gate insulating film GI may be higher than that of the nitrogen (N) in the second portion P2 of the gate insulating film GI. Here, when the component concentration of the nitrogen (N) increases, the negative degradation may be improved.

A component concentration of a specific material including at least one specific element among the two or more specific elements may be different between the first portion P1 of the gate insulating film GI and the second portion P2 of the gate insulating film GI. For example, the specific material may include silicon nitride (SiN), hydroxide (OH), or the like.

Figure 7:
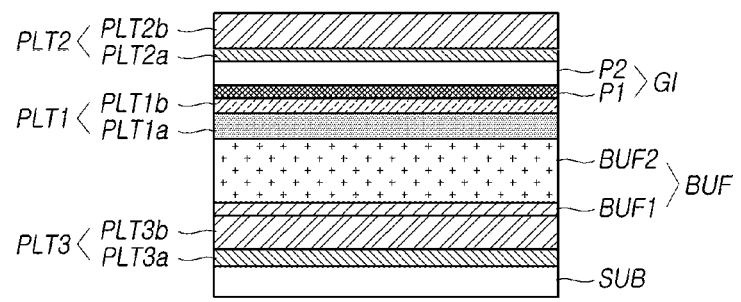
FIG. 7 is a cross-sectional view illustrating a structure of a storage capacitor in the display device according to embodiments.

FIG. 7 is a cross-sectional view illustrating a structure of the storage capacitor Cst in the display device 100 according to embodiments.

Referring to FIG. 7, the storage capacitor Cst may include a first capacitor electrode PLT1 and a second capacitor electrode PLT2 overlapping the first capacitor electrode PLT1. The first portion P1 and the second portion P2 of the gate insulating film GI may be located between the first capacitor electrode PLT1 and the second capacitor electrode PLT2.

Referring to FIG. 7, the storage capacitor Cst may further include a third capacitor electrode PLT3. The buffer layer BUF may be located between the first capacitor electrode PLT1 and the third capacitor electrode PLT3.

Referring to FIG. 7, the third capacitor electrode PLT3 of the storage capacitor Cst may be an electrode from which the light shield LS is extended, an electrode electrically connected to the light shield LS, or an electrode including the same metal as a metal included in the light shield LS.

When the light shield LS includes the lower light shield LSa and the upper light shield LSb, the third capacitor electrode PLT3 may include a third lower capacitor electrode PLT3a and a third upper capacitor electrode PLT3b.

The third lower capacitor electrode PLT3a may be an electrode from which the lower light shield LSa is extended, an electrode electrically connected to the lower light shield LSa, or an electrode including the same metal as a metal included in the lower light shield LSa.

The third upper capacitor electrode PLT3b may be an electrode from which the upper light shield LSb is extended, an electrode electrically connected to the upper light shield LSb, or an electrode including the same metal as a metal included in the upper light shield LSb.

Referring to FIG. 7, the first capacitor electrode PLT1 of the storage capacitor Cst may be formed of a single layer including a semiconductor material included in the active layer ACT. In this case, the first capacitor electrode PLT1 may be an electrode made conductive with the same semiconductor material as the semiconductor material of the active layer ACT.

When the first auxiliary electrode AUX1 and the second auxiliary electrode AUX2 are further disposed on the active layer ACT, the first capacitor electrode PLT1 of the storage capacitor Cst may include a first lower capacitor electrode PLT1a and a first upper capacitor electrode PLT1b.

The first lower capacitor electrode PLT1a may include the semiconductor material included in the active layer ACT. Here, the first lower capacitor electrode PLT1a may be a non-conductive semiconductor material or a conductive semiconductor material.

The first upper capacitor electrode PLT1b may include the same material as the first auxiliary electrode AUX1 and the second auxiliary electrode AUX2. For example, the first upper capacitor electrode PLT1b may include the metal (e.g., MoTi or the like) included in the first electrode E1, the second electrode E2, or the third electrode E3. Alternatively, the first upper capacitor electrode PLT1b may include a conductive oxide (e.g., indium zinc oxide (IZO) or the like). By including the same material in the first upper capacitor electrode PLT1b as the first auxiliary electrode AUX1 and the second auxiliary electrode AUX2, the storage capacitor Cst can be manufactured more efficiently alongside the transistor TR.

Referring to FIG. 7, the second capacitor electrode PLT2 of the storage capacitor Cst may be an electrode from which the first electrode E1, the second electrode E2, or the third electrode E3 is extended, may be an electrode electrically connected to the first electrode E1, the second electrode E2, or the third electrode E3, or may be an electrode including the same metal as the first electrode E1, the second electrode E2, or the third electrode E3.

When the third electrode E3 includes the third lower electrode E3a and the third upper electrode E3b, the second capacitor electrode PLT2 may include a second lower capacitor electrode PLT2a and a second upper capacitor electrode PLT2b.

The second lower capacitor electrode PLT2a may include a metal included in the lower electrode E1a, E2a, or E3a of the first electrode E1, the second electrode E2, or the third electrode E3. The second upper capacitor electrode PLT2b may include a metal included in the upper electrode E1b, E2b, or E3b of the first electrode E1, the second electrode E2, or the third electrode E3.

By including the same materials in the same layer order as those used in the transistor TR to form the capacitor Cst, a manufacturing of the display device may be simplified and made more efficient, leading to reduction in manufacturing times and costs.

The storage capacitor Cst may be connected between a source node and a gate node of the transistor TR, when the transistor TR is the driving transistor DRT. For example, in the transistor TR, when the transistor TR is the driving transistor DRT, the source node may be the first electrode E1 or the second electrode E2, and the gate node may be the third electrode E3. The first electrode E1 or the second electrode E2, which is the source node of the transistor TR, when the transistor TR is the driving transistor DRT, may be electrically connected to the light shield LS.

For example, in the storage capacitor Cst, the second capacitor electrode PLT2 may be electrically connected to the source node (e.g., the first electrode E1 or the second electrode E2) of the driving transistor DRT, the first capacitor electrode PLT1 may be electrically connected to the gate node (the third electrode E3) of the driving transistor DRT, and the third capacitor electrode PLT3 may be electrically connected to the source node (e.g., the first electrode E1 or the second electrode E2) of the driving transistor DRT. Accordingly, the storage capacitor Cst may have a structure in which two capacitors are connected in parallel, and thus a capacitance value of the storage capacitor Cst may increase.

The two capacitors connected in parallel to form the storage capacitor Cst may include a first capacitor formed between the first capacitor electrode PLT1 and the second capacitor electrode PLT2, and a second capacitor formed between the first capacitor electrode PLT1 and the third capacitor electrode PLT3.

Figure 8:
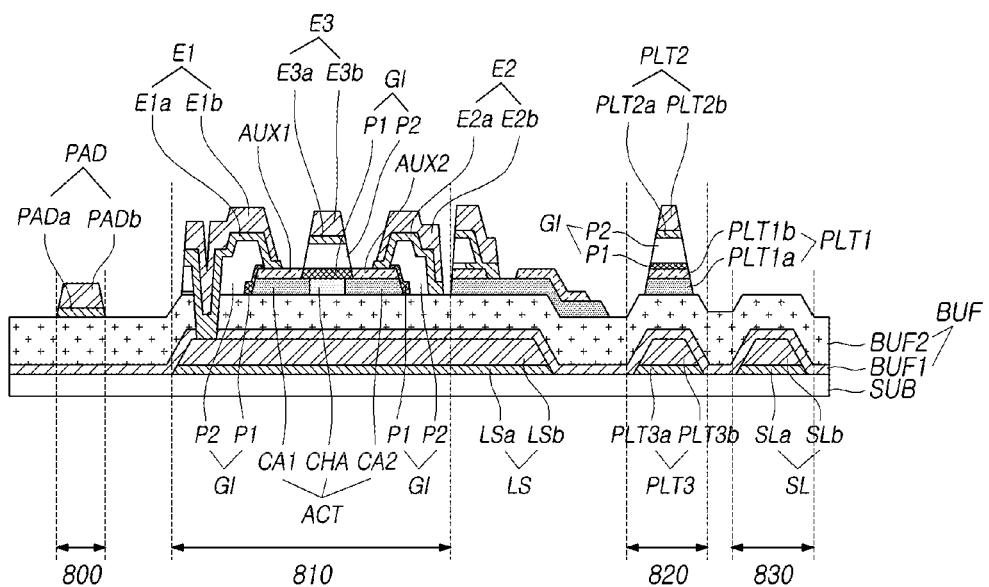
FIGS. 8 and 9 are cross-sectional views of a display panel according to embodiments.
Figure 9:
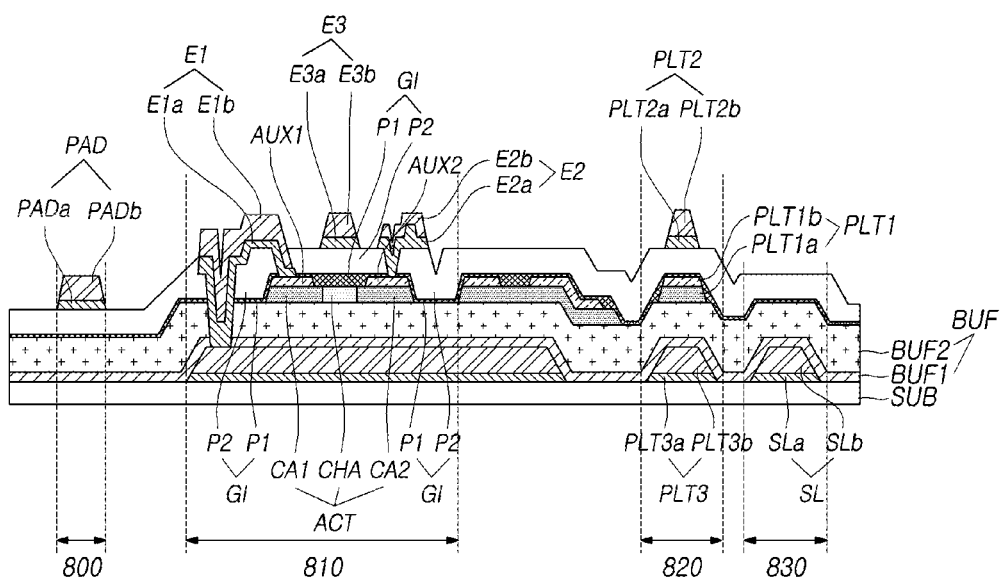

FIGS. 8 and 9 are cross-sectional views of the display panel 110 according to embodiments.

FIG. 8 is a cross-sectional view of the display panel 110 in which the driving transistor DRT having the transistor structure of FIG. 5 and the storage capacitor Cst of FIG. 7 are disposed, and FIG. 9 is a cross-sectional view of the display panel 110 in which the driving transistor DRT having the transistor structure of FIG. 6 and the storage capacitor Cst of FIG. 7 are disposed.

Referring to FIGS. 8 and 9, the display panel 110 according to embodiments may include a transistor area 810, a storage capacitor area 820, a signal line area 830, and a pad area 800.

The transistor area 810 may be present in both the display area DA and the non-display area NDA in the display panel 110. The transistor area 810 of FIGS. 8 and 9 is an example of a transistor area included in the display area DA.

The driving transistor DRT disposed in the transistor area 810 of FIG. 8 may have the transistor structure of FIG. 5. In contrast, the driving transistor DRT disposed in the transistor area 810 of FIG. 9 may have the transistor structure of FIG. 6.

Referring to FIGS. 8 and 9, the first electrode E1 of the transistor TR may be electrically connected to the light shield LS through a through-hole of the buffer layer BUF.

The storage capacitor Cst of FIG. 7 may be disposed in the storage capacitor area 820 of FIGS. 8 and 9.

Referring to FIGS. 8 and 9, a signal line SL for signal transmission may be disposed in the signal line area 830. For example, the signal line SL may include a data line DL, a driving voltage line DVL, a reference voltage line RVL, or the like.

The signal line SL may include a lower signal line SLa and an upper signal line SLb connected to each other. The lower signal line SLa may include the metal included in the lower light shield LSa. The upper signal line SLb may include the metal included in the upper light shield LSb.

Referring to FIGS. 8 and 9, the pad area 800 may be located in the non-display area NDA located on an outer periphery of the display area DA, and a pad part PAD may be disposed in the pad area 800 in the non-display area NDA. An integrated circuit may be electrically connected to the pad part PAD. For example, the integrated circuit electrically connected to the pad part PAD may be a source driver integrated circuit in which the data driving circuit 120 is implemented.

The pad part PAD may include a lower pad PADa and an upper pad PADb which are connected to each other. The lower pad PADa may include the metal included in the first to third lower electrodes E1a to E3a of the first to third electrodes E1 to E3 or may include the metal included in the first and second auxiliary electrodes AUX1 and AUX2. The upper pad PADb may include the metal included in the first to third upper electrodes E1b to E3b of the first to third electrodes E1 to E3.

Referring to FIG. 9, when the transistor TR has a gate insulating film etchless structure, the gate insulating film GI may be disposed in the entire area of the display panel 110. Accordingly, the first portion P1 and the second portion P2 of the gate insulating film GI may extend below the pad part PAD disposed in the pad area 800, and the first portion P1 and the second portion P2 of the gate insulating film GI may extend above the signal line SL.

Figure 10A:
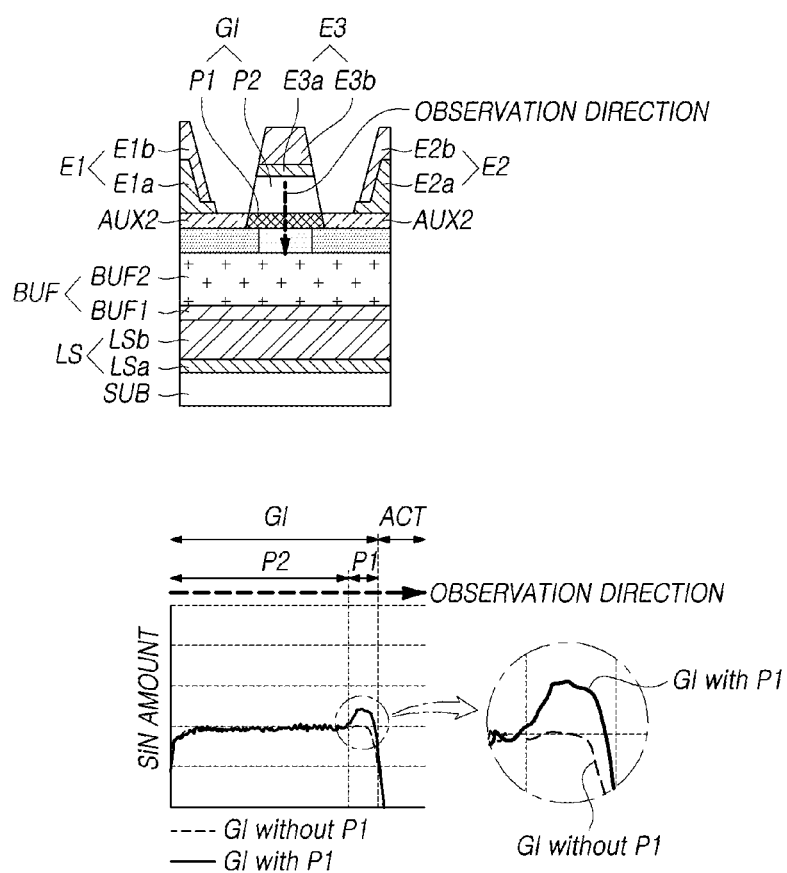
FIGS. 10A, 10B, and 10C are graphs illustrating a result of measuring a change in component concentration of a specific element or a specific material between a gate insulating film and an active layer, under the structure of the transistor according to embodiments.
Figure 10B:
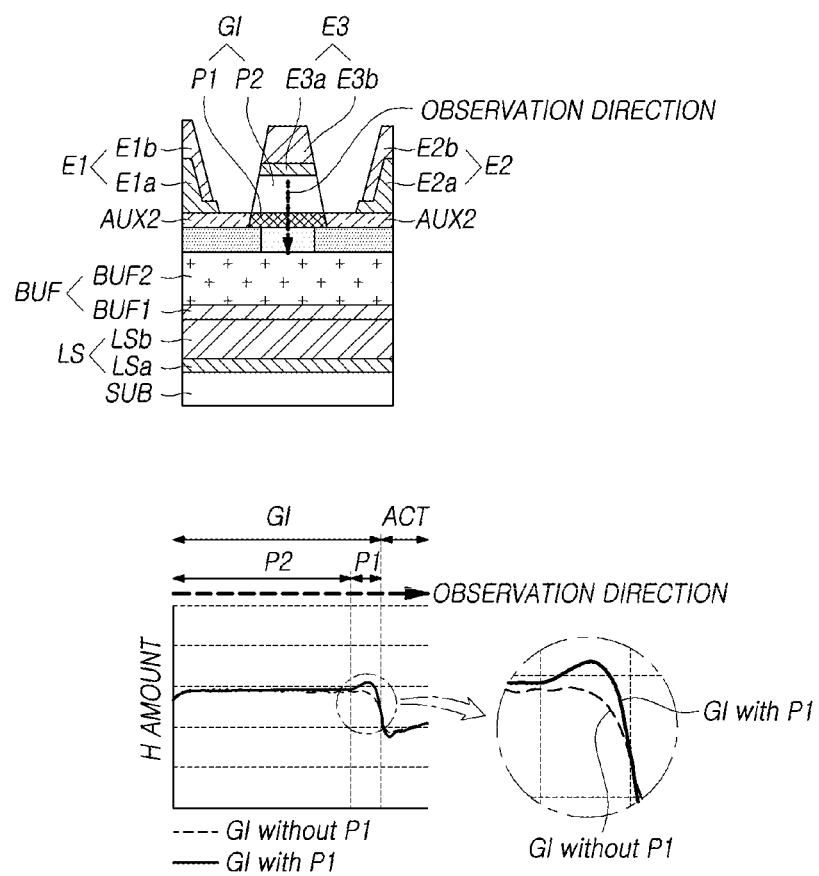
Figure 10C:
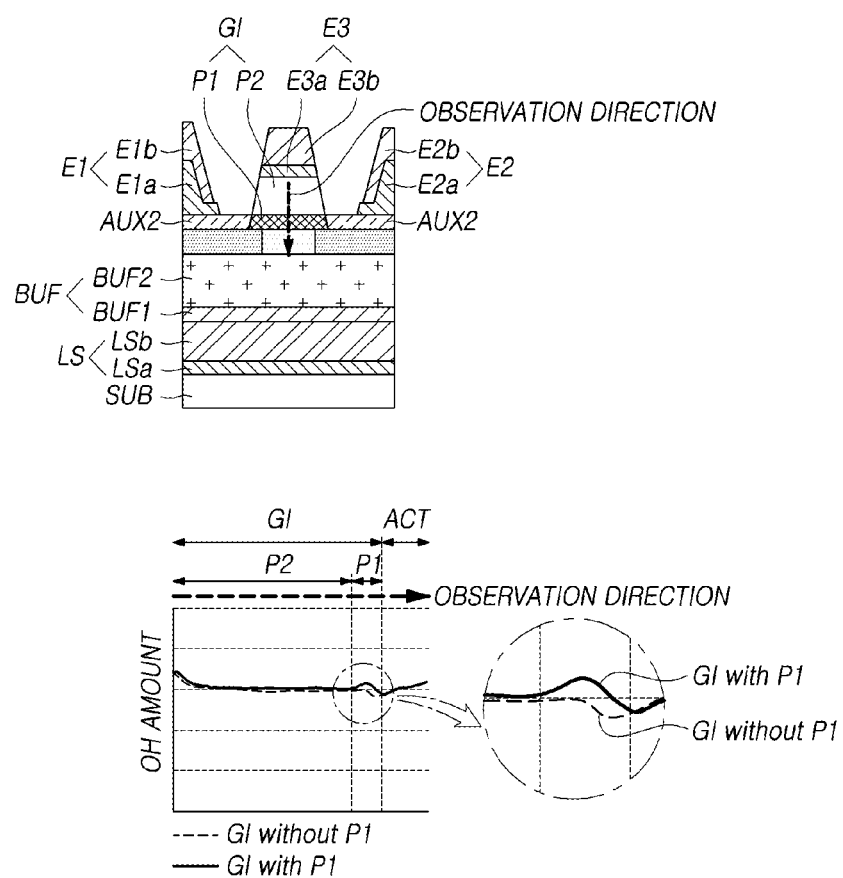

FIGS. 10A, 10B, and 10C are graphs illustrating a result of measuring a change in component concentration of a specific element or a specific material between the gate insulating film GI and the active layer ACT, under the structure of the transistor TR according to embodiments.

FIG. 10A is a graph obtained by measuring a change in component concentration of silicon nitride (SiN), as the specific material including specific elements (Si and N), between the gate insulating film GI and the active layer ACT.

FIG. 10B is a graph obtained by measuring a change in component concentration of hydrogen (H), as the specific element, between the gate insulating film GI and the active layer ACT. FIG. 10C is a graph obtained by measuring a change in component concentration of hydroxide (OH), as the specific material including a specific element (H), between the gate insulating film GI and the active layer ACT.

Referring to FIGS. 10A, 10B, and 10C, an observation direction of the component concentration is a direction toward the active layer ACT through the first portion P1 of the gate insulating film GI from the second portion P2 of the gate insulating film GI.

Referring to FIGS. 10A, 10B, and 10C, the first portion P1 of the gate insulating film GI may be located closer to the active layer ACT than the second portion P2 of the gate insulating film GI.

Referring to FIG. 10A, it can be seen that the component concentration of the silicon nitride (SiN) rapidly (wherein rapidly may be understood to mean markedly or sharply) increases when an observation position is changed to the first portion P1 from the second portion P2 in the gate insulating film GI. In other words, the concentration of the silicon nitride transitions from a lower to a higher value when the observation position enters the first portion P1 from the second portion. The transition gradient may be said to be highest in the region after entering the first portion P1 from the second portion P2.

Referring to FIG. 10A, it can be seen that the component concentration of the silicon nitride (SiN) rapidly decreases when the observation position is changed to the active layer ACT from the first portion P1 of the gate insulating film GI.

Referring to FIG. 10B, it can be seen that the component concentration of the hydrogen (H) rapidly increases when the observation position is changed to the first portion P1 from the second portion P2 in the gate insulating film GI.

Referring to FIG. 10B, it can be seen that the component concentration of the hydrogen (H) rapidly decreases when the observation position is changed to the active layer ACT from the first portion P1 of the gate insulating film GI.

Referring to FIG. 10C, it can be seen that the component concentration of the hydroxide (OH) increases when the observation position is changed to the first portion P1 from the second portion P2 in the gate insulating film GI.

Referring to FIG. 10C, it can be seen that the component concentration of the hydroxide (OH) slightly decreases when the observation position is changed to the active layer ACT from the first portion P1 of the gate insulating film GI.

Figure 11:
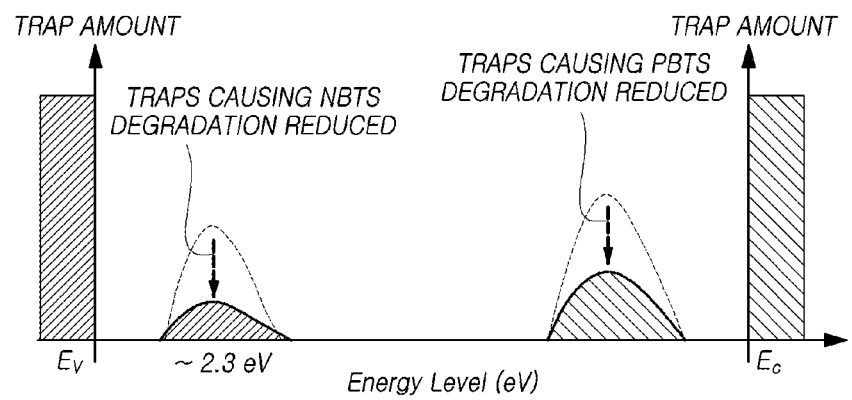
FIG. 11 is a graph illustrating an effect of an improvement on bidirectional degradation according to the structure of the transistor according to embodiments.

FIG. 11 is a graph illustrating an effect of an improvement on bidirectional degradation according to the structure of the transistor TR according to embodiments.

The graph of FIG. 11 illustrates the amount of traps generated in a band gap between a conduction band and a valance band. In the graph, an X-axis refers to an energy level (eV), and a Y-axis refers to the amount of traps.

In the present specification, the term "trap" may refer to a phenomenon in which carriers such as electrons or holes are trapped at an interface between the active layer ACT and the gate insulating film GI or at the active layer ACT, or trapped carriers, or may refer to a kind of defect.

Referring to FIG. 11, traps that cause PBTS degradation may be generated at energy levels adjacent to conduction band edge energy Ec in the band gap. Here, the conduction band edge energy Ec may be the lowest energy in the conduction band.

Referring to FIG. 11, traps that cause NBTS degradation may be generated at energy levels adjacent to valance band edge energy Ev in the band gap. Here, the valance band edge energy Ev may be the highest energy in the valance band.

As described above, the first portion P1 of the gate insulating film GI and the second portion P2 of the gate insulating film GI may commonly include two or more specific elements. For example, the two or more specific elements should include at least one first element and at least one second element, and the first element and the second element may be elements that perform different roles.

A component concentration of the specific element in the first portion P1 of the gate insulating film GI may be higher than that of the specific element in the second portion P2 of the gate insulating film GI. Here, the first portion P1 of the gate insulating film GI may be located closer to the active layer ACT than the second portion P2 of the gate insulating film GI.

Since the specific element is contained in a large amount in the first portion P1 of the gate insulating film GI, the specific element contained in a large amount in the first portion P1 of the gate insulating film GI may be diffused or transmitted to the active layer ACT. Accordingly, the traps generated at the interface between the first portion P1 of the gate insulating film GI and the active layer ACT may be removed by the specific element.

In this case, when the traps are removed by the specific element, depending on the type of the specific element, the positive degradation (PBTS degradation) of the transistor TR may be improved, or the negative degradation (NBTS degradation) of the transistor TR may be improved.

The specific element contained in a sufficient amount in the first portion P1 of the gate insulating film GI of the display device 100 according to embodiments may include a first element and a second element that perform different roles. For example, the first element may include hydrogen (H) or the like, and the second element may include silicon (Si) or the like.

Referring to FIG. 11, in the display device 100 according to embodiments, when silicon (Si) is contained in a large amount in the first portion P1 of the gate insulating film GI, many of the traps, which cause the negative degradation (NBTS degradation) and are generated at the interface between the gate insulating film GI and the active layer ACT, may be removed by the silicon (Si). Accordingly, the negative degradation (NBTS degradation) may be improved.

Referring to FIG. 11, when hydrogen (H) is contained in a large amount in the first portion P1 of the gate insulating film GI, many of the traps, which cause the positive degradation (PBTS degradation) and are generated at the interface between the gate insulating film GI and the active layer ACT, may be removed by the hydrogen (H). Accordingly, the positive degradation (PBTS degradation) may be improved.

Referring to FIG. 11, in the display device 100 according to embodiments, since at least one first element (e.g., H) and at least one second element (e.g., Si) are contained in large amounts in the first portion P1 of the gate insulating film GI, both the positive degradation (PBTS degradation) and the negative degradation (NBTS degradation) may be improved. That is, in the display device 100 according to embodiments, since at least one first element (e.g., H) and at least one second element (e.g., Si) are contained in large amounts in the first portion P1 (e.g., larger amounts than in the second portion P2) of the gate insulating film GI, the bidirectional degradation may be improved.

Meanwhile, when oxygen (O) is contained in a small amount in the first portion P1 (e.g., smaller amounts than in the second portion P2) of the gate insulating film GI, this may help to improve the positive degradation (PBTS degradation). In addition, when nitrogen (N) is contained in a large amount in the first portion P1 (e.g., larger amounts than in the second portion P2) of the gate insulating film GI, this may help to improve the negative degradation (NBTS degradation).

As described above with reference to FIG. 11, due to a unique structure of the gate insulating film GI, the display device 100 according to embodiments may improve both the positive degradation and the negative degradation. Accordingly, instantaneous afterimages generated due to the positive degradation and the negative degradation may be prevented.

Hereinafter, traps, instantaneous afterimages, and current abnormality, which are generated in a conventional display device, will be described first with reference to FIGS. 12 to 14, and the removal of the traps, the prevention of the instantaneous afterimages, and the mitigation of the current abnormality will be described with reference to FIGS. 15 to 17 in relation to the improvement of bidirectional degradation.

Figure 12:
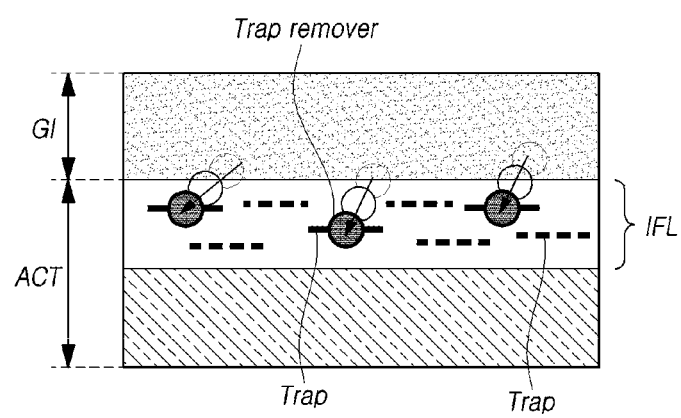
FIG. 12 is a conceptual diagram illustrating traps generated at an interface between an active layer and a gate insulating film when the structure of the transistor according to embodiments is not applied.

FIG. 12 is a conceptual diagram illustrating traps generated at an interface between an active layer ACT and a gate insulating film GI when the structure of the transistor TR according to embodiments is not applied.

Referring to FIG. 12, traps of carriers (e.g., electrons or holes) generated in an interface layer IFL between the gate insulating film GI and the active layer ACT may be generated.

Referring to FIG. 12, the interface layer IFL may be included in the gate insulating film GI. Alternatively, a portion of the interface layer IFL may be included in the gate insulating film GI, and the remaining portion of the interface layer IFL may be included in the active layer ACT.

Referring to FIG. 12, some of the traps generated in the interface layer IFL may be removed by trap removers supplied from the gate insulating film GI. However, the rest of the traps generated in the interface layer IFL may not be removed and remain as they are.

Figure 13:
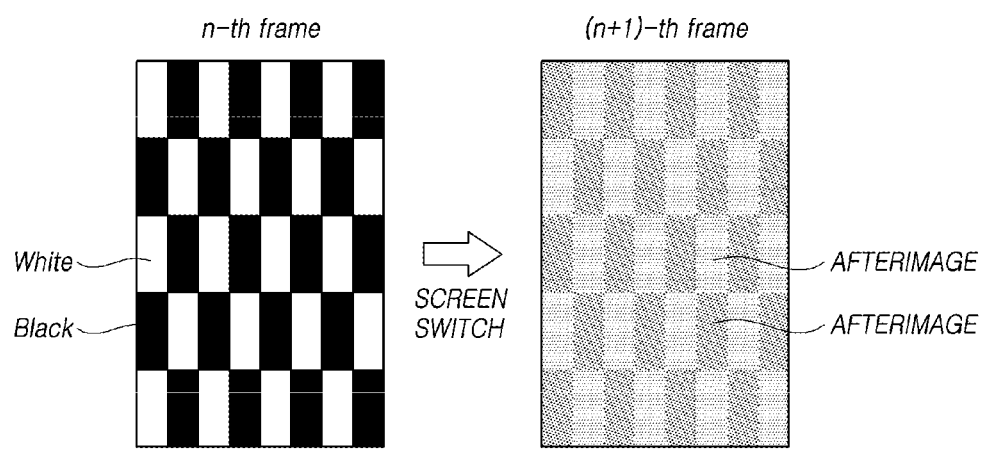
FIG. 13 illustrates a screen in which afterimages are generated when a screen is switched when the structure of the transistor according to embodiments is not applied.

FIG. 13 illustrates a screen in which afterimages are generated when a screen is switched when the structure of the transistor TR according to embodiments is not applied.

Referring to FIG. 13, an n-th frame may include a partial image on which white corresponding to a 255 grayscale 255G is displayed and a partial image on which black corresponding to a 0 grayscale 0G is displayed. For example, the n-th frame may be similar to a chess board image.

Referring to FIG. 13, afterimages may be generated in an (n+1)-th frame when the n-th frame is screen-switched to the (n+1)-th frame where the entirety should be displayed in gray corresponding to a 32 grayscale 32G.

Referring to FIG. 13, the afterimages generated in the (n+1)-th frame are afterimages of the partial images displayed in the white (255G) and the black (0G) in the n-th frame.

Referring to FIG. 13, an area displayed in the white (255G) in the n-th frame may be displayed in gray different from the gray (32G) desired in the (n+1)-th frame. An area displayed in the black (0G) in the n-th frame may be displayed in gray different from the gray (32G) desired in the (n+1)-th frame. Accordingly, an image in the form of a chess board displayed in the n-th frame is viewed as an instantaneous afterimage in the (n+1)-th frame.

Figure 14:
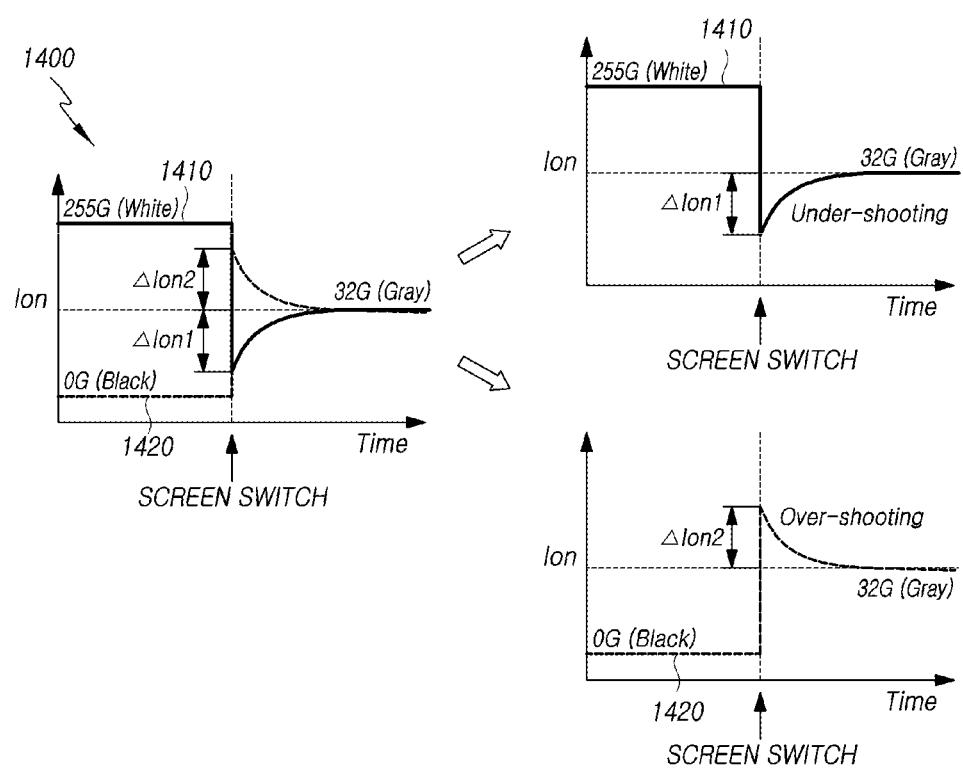
FIG. 14 is a view for describing a cause of an afterimage phenomenon generated when the structure of the transistor according to embodiments is not applied.

FIG. 14 is a view for describing a cause of an afterimage phenomenon generated when the structure of the transistor TR according to embodiments is not applied.

In FIG. 14, a graph 1400 including a first graph 1410 and a second graph 1420 is illustrated, and the first graph 1410 and the second graph 1420 are separately illustrated.

Referring to FIG. 14, the first graph 1410 is a graph illustrating a change in an on-current Ion flowing through driving transistors DRT in sub-pixels SP that emit light to display white (255G) in an n-th frame when a screen is switched from the n-th frame to an (n+1)-th frame.

Referring to FIG. 14, the second graph 1420 is a graph illustrating a change in the on-current Ion flowing through the driving transistors DRT in the sub-pixels SP that emit light to display black (0G) in the n-th frame when a screen is switched from the n-th frame to the (n+1)-th frame.

Referring to the first graph 1410 of FIG. 14, the current flowing through the driving transistors DRT in the sub-pixels SP in the area, in which display color should be changed from the white (255G) to the gray (32G) at a time point in which the screen is switched, may be undershot from a current value corresponding to the white grayscale (255G) to a current value much less than a current value corresponding to the target grayscale (32G), and then changed to the current value corresponding to the target grayscale (32G).

In the first graph 1410 of FIG. 14, the under-shooting may be generated by traps. Due to an on-current variation $\Delta$Ion1 caused by the under-shooting, an instantaneous afterimage appears at the time point at which the white is switched to the desired gray.

Referring to the second graph 1420 of FIG. 14, the current flowing through the driving transistors DRT in the sub-pixels SP in the area, in which display color should be changed from the black (0G) to the gray (32G) at the time point in which the screen is switched, may be overshot from a current value corresponding to the black grayscale (0G) to a current value much greater than the current value corresponding to the target grayscale (32G), and then changed to the current value corresponding to the target grayscale (32G).

In the second graph 1420 of FIG. 14, the over-shooting is generated by traps. Due to an on-current variation $\Delta$Ion2 caused by the over-shooting, an instantaneous afterimage appears at the time point at which the black is switched to the desired gray.

Figure 15:
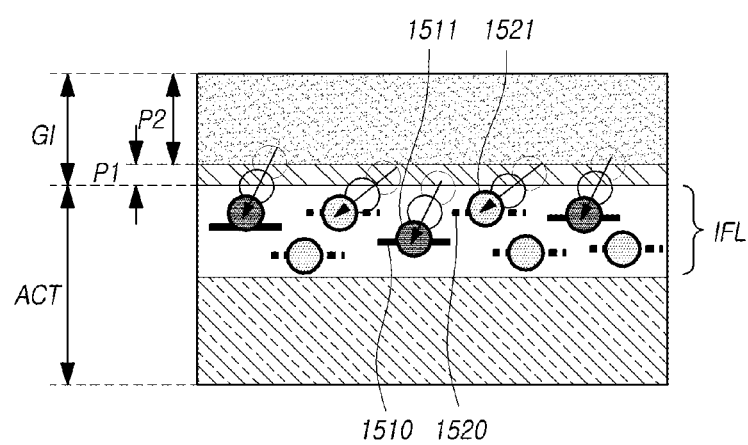
FIG. 15 is a conceptual diagram illustrating a phenomenon in which traps generated at the interface between the active layer and the gate insulating film are removed when the structure of the transistor according to embodiments is applied.

FIG. 15 is a conceptual diagram illustrating a phenomenon in which the traps generated at the interface between the active layer ACT and the gate insulating film GI are removed when the structure of the transistor TR according to embodiments is applied.

Referring to FIG. 15, traps 1510 and 1520 of carriers (e.g., electrons or holes) generated at an interface layer IFL between the gate insulating film GI and the active layer ACT may be generated. Here, the interface layer IFL may be included in the gate insulating film GI. Alternatively, a portion of the interface layer IFL may be included in the gate insulating film GI, and the remaining portion of the interface layer IFL may be included in the active layer ACT.

Referring to FIG. 15, in the display panel 110 of the display device 100 according to embodiments, trap removers 1511 and 1521 may be contained in a large amount in the first portion P1 adjacent to the active layer ACT among the first portion P1 and the second portion P2 included in the gate insulating film GI.

The trap removers 1511 and 1521 may be specific elements (e.g., hydrogen, silicon, and the like) that are contained more (i.e., in greater amounts or proportions) in the first portion P1 of the gate insulating film GI than in the second portion P2 of the gate insulating film GI.

Referring to FIG. 15, the traps 1510 and 1520 generated in the interface layer IFL may include a first trap 1510 that causes positive degradation and a second trap 1520 that causes negative degradation.

Referring to FIG. 15, the trap removers 1511 and 1521 may include a first trap remover 1511 which can remove the first trap 1510 and a second trap remover 1521 which can remove the second trap 1520.

Referring to FIG. 15, the first trap remover 1511 may include hydrogen (H) or a material including the same. The second trap remover 1521 may include silicon (Si) or a material including the same.

Referring to FIG. 15, in the display panel 110 of the display device 100 according to embodiments, two types of trap removers 1511 and 1521 which can remove two types of traps 1510 and 1520 may be contained in a larger amount in the first portion P1, which is adjacent to the active layer ACT, in the gate insulating film GI. Thus, according to the structure of the gate insulating film GI according to embodiments, both the positive degradation and the negative degradation may be improved.

Figure 16:
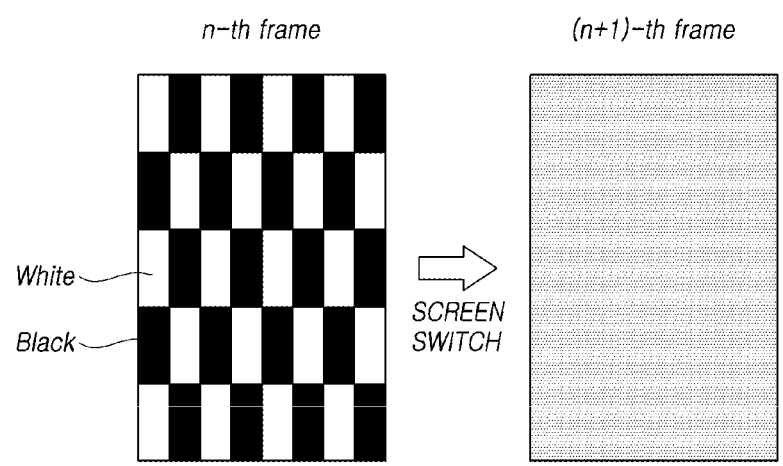
FIG. 16 illustrates a screen in which afterimages are not generated when a screen is switched when the structure of the transistor according to embodiments is applied.

FIG. 16 illustrates a screen in which afterimages are not generated when a screen is switched when the structure of the transistor TR according to embodiments is applied.

Referring to FIG. 16, an n-th frame may include a partial image on which white corresponding to a 255 grayscale 255G is displayed and a partial image on which black corresponding to a 0 grayscale 0G is displayed. For example, the n-th frame may be similar to a chess board image.

Referring to FIG. 16, an (n+1)-th frame may be displayed in a desired form without having afterimages when the n-th frame is screen-switched to the (n+1)-th frame where the entirety should be displayed in gray corresponding to a 32 grayscale 32G.

Although the chess board image, which may cause an instantaneous afterimage, is displayed in the n-th frame, a gray image may be clearly displayed in the entire area without generating afterimages in the (n+1)-th frame.

The instantaneous afterimages are not generated as described above because the traps 1510 and 1520 that cause the positive degradation and the negative degradation, respectively, are all removed as described above with reference to FIG. 15.

Figure 17:
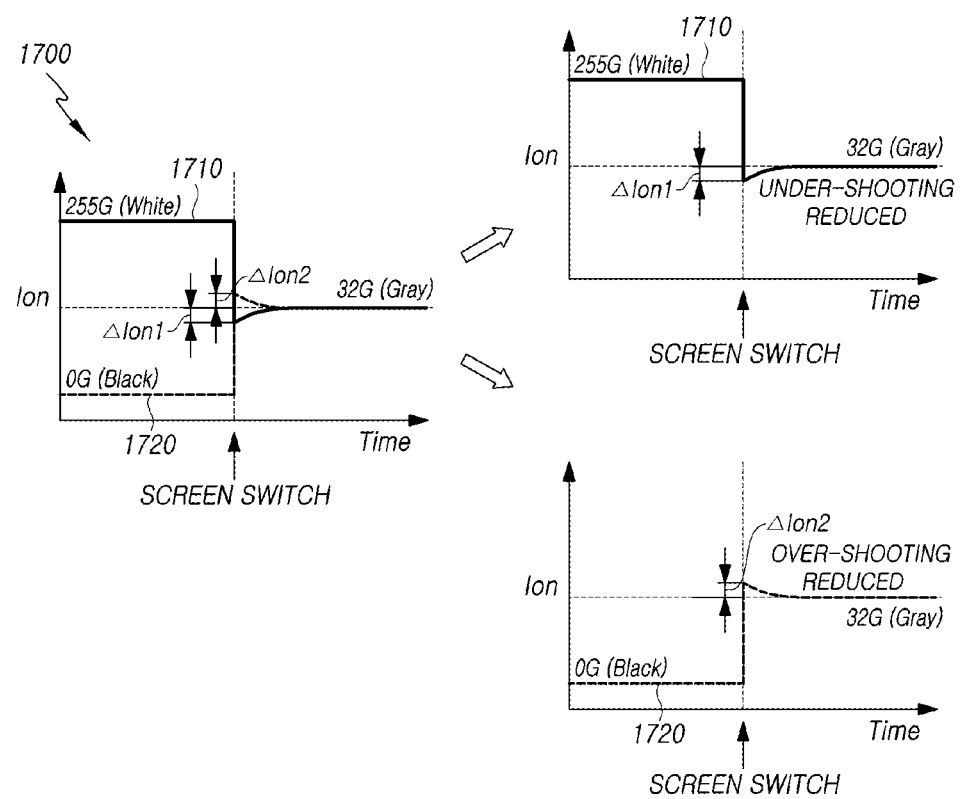
FIG. 17 is a view for describing a principle in which afterimages are not caused when the structure of the transistor according to embodiments is applied.

FIG. 17 is a view for describing a principle in which afterimages are not caused when the structure of the transistor TR according to embodiments is applied.

In FIG. 17, a graph 1700 including a first graph 1710 and a second graph 1720 is illustrated, and the first graph 1710 and the second graph 1720 are separately illustrated.

Referring to FIG. 17, the first graph 1710 is a graph illustrating a change in an on-current Ion flowing through driving transistors DRT in sub-pixels SP that emit light to display white (255G) in an n-th frame when a screen is switched from the n-th frame to an (n+1)-th frame.

Referring to FIG. 17, the second graph 1720 is a graph illustrating a change in the on-current Ion flowing through the driving transistors DRT in the sub-pixels SP that emit light to display black (0G) in the n-th frame when a screen is switched from the n-th frame to the (n+1)-th frame.

Referring to the first graph 1710 of FIG. 17, the current flowing through the driving transistors DRT in the sub-pixels SP in the area, in which display color should be changed from the white (255G) to the gray (32G) at a time point in which the screen is switched, may be slightly undershot from a current value corresponding to the white grayscale (255G) to a current value slightly less than a current value corresponding to the target grayscale (32G), and then rapidly changed to the current value corresponding to the target grayscale (32G).

In the first graph 1710 of FIG. 17, the under-shooting is significantly reduced as compared to the under-shooting of FIG. 14. This is due to the removal of the traps. As an on-current variation ΔIon1 is reduced due to the reduction of the under-shooting, the instantaneous afterimage may be reduced or removed at the time point at which white is switched to the desired gray.

Referring to the second graph 1720 of FIG. 17, the current flowing through the driving transistors DRT in the sub-pixels SP in the area, in which display color should be changed from the black (0G) to the gray (32G) at the time point in which the screen is switched, may be slightly overshot from a current value corresponding to the black grayscale (0G) to a current value slightly greater than the current value corresponding to the target grayscale (32G), and then rapidly changed to the current value corresponding to the target grayscale (32G).

In the second graph 1720 of FIG. 17, the over-shooting is significantly reduced as compared to the over-shooting of FIG. 14. This is due to the removal of the traps. As an on-current variation ΔIon2 is reduced due to the reduction of the over-shooting, the instantaneous afterimage may be reduced or removed at the time point at which black is switched to the desired gray.

Meanwhile, referring to FIG. 17, when the embodiments are applied, over-shooting and/or under-shooting may be reduced, and also, in some cases, the over-shooting and/or the under-shooting itself may not be generated (i.e., eliminated).

According to the display device 100 according to embodiments, an under-shooting value or an over-shooting value of the on-current of the transistor TR at a time point (that is, at a time point at which the screen is switched) at which a voltage (data voltage) applied to the third electrode E3 of the transistor TR is changed may be within a value predetermined according to a component concentration difference of the specific element or the specific material between the first portion P1 and the second portion P2 of the gate insulating film GI.

Figure 18A:
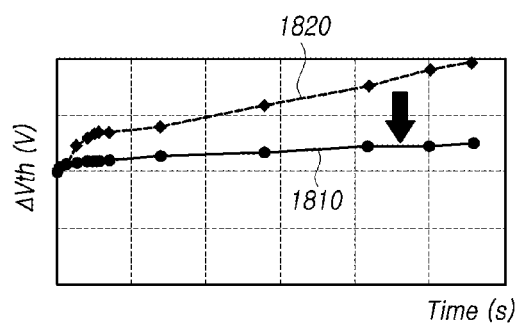
FIGS. 18A and 18B are graphs obtained by analyzing device reliability when the structure of the transistor according to embodiments is applied.
Figure 18B:
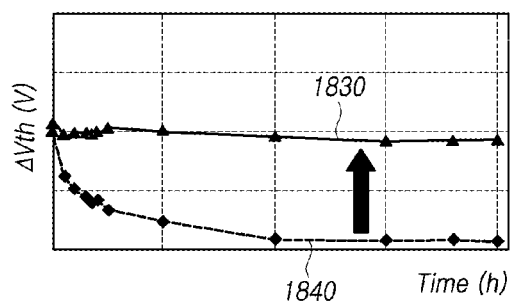

FIGS. 18A and 18B are graphs obtained by analyzing device reliability when the structure of the transistor TR according to embodiments is applied.

FIG. 18A is a graph illustrating a variation ΔVth of a threshold voltage due to positive degradation caused by PBTS according to a driving time of the driving transistor DRT.

Referring to FIG. 18A, it can be seen that a variation 1810 of the threshold voltage of the driving transistor DRT when the structure of the gate insulating film GI according to embodiments is applied is greatly reduced compared to a variation 1820 of the threshold voltage of the driving transistor DRT when the structure of the gate insulating film GI according to embodiments is not applied.

FIG. 18B is a graph illustrating the variation ΔVth of the threshold voltage due to negative degradation caused by NBTS according to the driving time of the driving transistor DRT.

Referring to FIG. 18B, it can be seen that a variation 1830 of the threshold voltage of the driving transistor DRT when the structure of the gate insulating film GI according to embodiments is applied is greatly reduced compared to a variation 1840 of the threshold voltage of the driving transistor DRT when the structure of the gate insulating film GI according to embodiments is not applied.

Referring to FIGS. 18A and 18B, when the structure of the gate insulating film GI according to embodiments is applied, bidirectional degradation including both the positive degradation and the negative degradation may be improved.

Referring to FIGS. 18A and 18B, the time-dependent variation ΔVth of the threshold voltage of the transistor TR may be within a value predetermined according to a component concentration difference of the specific element or the specific material between the first portion P1 and the second portion P2 of the gate insulating film GI.

Figure 19:
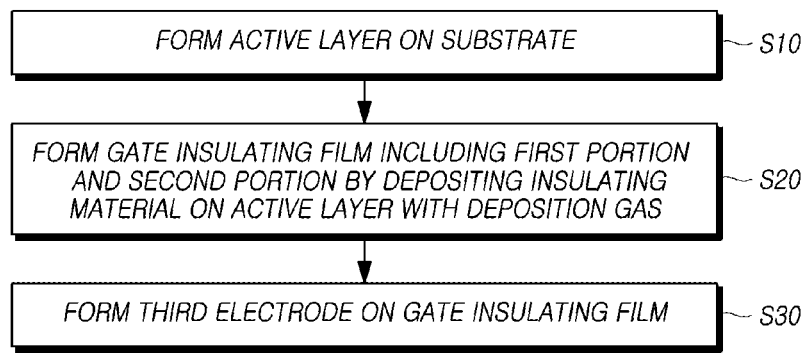
FIG. 19 is a flowchart for describing a manufacturing method of the display device according to embodiments.

FIG. 19 is a flowchart for describing a manufacturing method of the display device 100 according to embodiments.

Referring to FIG. 19, the manufacturing method of the display device 100 according to embodiments may include forming an active layer ACT on a substrate SUB (S10), forming a gate insulating film GI including a first portion P1 and a second portion P2 by depositing an insulating material on the active layer ACT with a deposition gas (S20), and forming a third electrode E3 on the gate insulating film GI (S30).

In the gate insulating film GI, the first portion P1 may be closer to the active layer ACT than the second portion P2, and the second portion P2 may be closer to the third electrode E3 than the first portion P1.

The gate insulating film GI may include two or more specific elements having different component concentrations in the first portion P1 and the second portion P2.

For example, the two or more specific elements may include at least one of hydrogen and oxygen and at least one of silicon and nitrogen.

For example, the deposition gas used in the forming of the gate insulating film GI (S20) may include silane ($SiH_4$), or may include nitrogen ($N_2$), or ammonia ($NH_3$), or the like.

Figure 20:
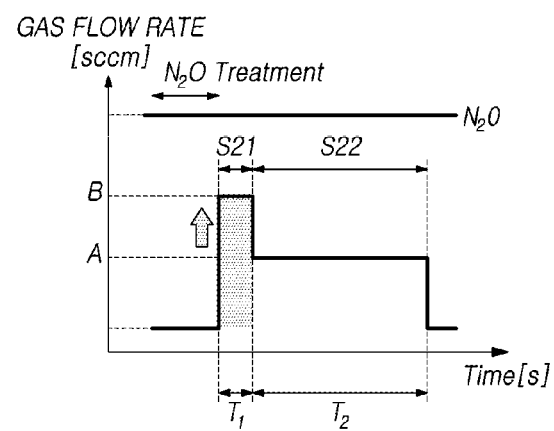
FIG. 20 is a graph illustrating a process method of forming a gate insulating film when manufacturing the display panel according to embodiments.

FIG. 20 is a graph illustrating a process method of forming the gate insulating film GI when manufacturing the display panel 110 according to embodiments.

In the graph of FIG. 20, an X-axis represents a time (s) and a Y-axis represents a flow rate of the deposition gas. A unit of the flow rate may be standard cubic centimeters per minute (SCCM).

Referring to FIG. 20, the forming of the gate insulating film GI (S20) may include a first operation S21 of forming the first portion P1 by depositing the insulating material (e.g., $SiO_2$) on the active layer ACT with the deposition gas having a first flow rate B and a second operation S22 of forming the second portion P2 by depositing the insulating material (e.g., $SiO_2$) on the first portion P1 with the deposition gas having a second flow rate A lower than the first flow rate B.

Referring to FIG. 20, the first operation S21 may be performed during a first time $T_1$, and the second operation S22 may be performed during a second time T2. The first operation S21 may be performed for a shorter time than the second operation S22.

A thickness of the first portion P1 formed in the first operation S21 may be less than a thickness of the second portion P2 formed in the second operation S22. In some embodiments, the thickness of the first portion P1 may be controlled by controlling the duration of the first operation (e.g., the first time $T_1$). Beneficially, controlling the thickness of the first portion P1 by controlling the time in which the first operation is performed allows the thickness of the first portion P1 to be varied without markedly changing the configuration of the manufacturing line and therefore allows the manufacturing to be scaled more efficiently.

Referring to FIG. 20, a nitrous oxide ($N_2O$) treatment may be performed prior to the forming of the gate insulating film GI (S20). Meanwhile, in the forming of the gate insulating film GI (S20), the silane ($SiH_4$) and the nitrous oxide ($N_2O$) may react, thereby performing the deposition process.

Meanwhile, as an example, the deposition gas used in the process operation (S20) of forming the gate insulating film GI may be silane ($SiH_4$). In this case, the silane ($SiH_4$) may be used as the deposition gas in both the first operation S21 and the second operation S22.

As another example, the deposition gas used in the process operation (S20) of forming the gate insulating film GI may further include nitrogen ($N_2$) and/or ammonia ($NH_3$), in addition to the silane ($SiH_4$). In this case, as an example, in the first operation S21, the nitrogen ($N_2$) and/or the ammonia ($NH_3$) may be used as the deposition gas instead of the silane ($SiH_4$), and in the second operation S22, the silane ($SiH_4$) may be used as the deposition gas.

In other words, as an example, in the process operation (S20) of forming the gate insulating film GI, the deposition gas used in the first operation S21 and the deposition gas used in the second operation S22 may be the same. As another example, in the process operation (S20) of forming the gate insulating film GI, the deposition gas used in the first operation S21 and the deposition gas used in the second operation S22 may be different from each other. For example, the nitrogen ($N_2$) or the ammonia ($NH_3$) may be used as the deposition gas in the first operation S21, and the silane ($SiH_4$) may be used as the deposition gas in the second operation S22.

Figure 21:
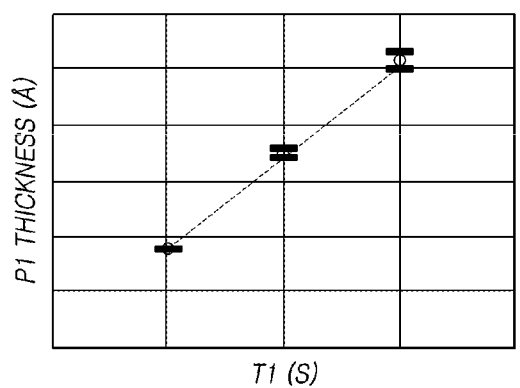
FIG. 21 is a graph illustrating a change in a thickness of a first portion of the gate insulating film according to a length of a first time, in which a first operation of a process operation of forming the gate insulating film is performed, when manufacturing the display panel according to embodiments.

FIG. 21 is a graph illustrating a change in the thickness of the first portion P1 of the gate insulating film GI according to a length of the first time T1, in which the first operation S21 of the process operation (S20) of forming the gate insulating film GI is performed, when manufacturing the display panel 110 according to embodiments.

Referring to FIG. 21, the thickness of the first portion P1 of the gate insulating film GI, which is formed in the first operation S21, may get thicker as the first time T1 in which the first operation S21 is performed increases.

FIGS. 22A to 22E are cross-sectional views illustrating process operations for manufacturing the display panel 110 in which the transistor TR according to embodiments has a gate insulating film etch structure. FIGS. 22A to 22E are cross-sectional views illustrating process operations for manufacturing the display panel 110 of FIG. 8.

Figure 22A:
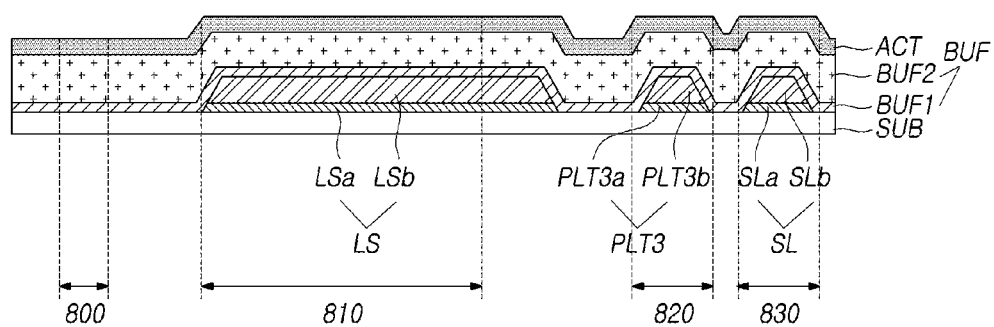
FIGS. 22A to 22E are cross-sectional views illustrating process operations for manufacturing the display panel in which the transistor according to embodiments has a gate insulating film etch structure.

Referring to FIG. 22A, a light shield LS including a lower light shield LSa and an upper light shield LSb may be formed on a substrate SUB. In this case, a signal line SL may be formed on the substrate SUB using the same material as the light shield LS. In addition, a third capacitor electrode PLT3 may be formed on the substrate SUB using the same material as the light shield LS.

Referring to FIG. 22A, a buffer layer BUF including a first buffer layer BUF1 and a second buffer layer BUF2 may be formed on the substrate SUB while covering the light shield LS, the signal line SL, and the third capacitor electrode PLT3.

Referring to FIG. 22A, an active layer ACT may be formed on the buffer layer BUF. For example, the active layer ACT may include indium gallium zinc oxide (IGZO).

Figure 22B:
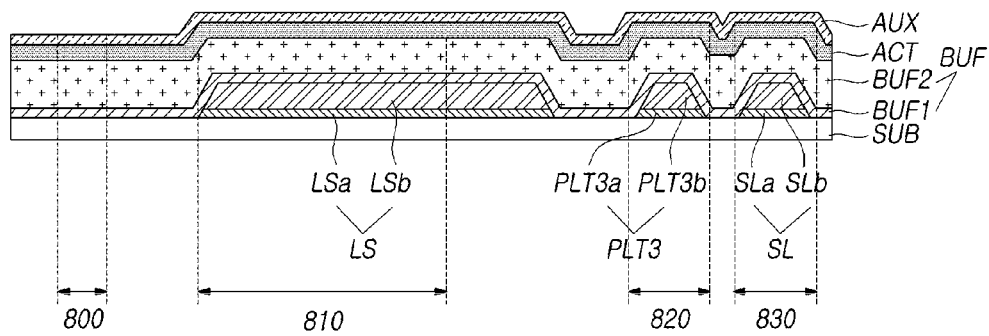

Referring to FIG. 22B, an auxiliary electrode material layer AUX may be formed on the active layer ACT. Here, the auxiliary electrode material layer AUX may be a layer for forming a first auxiliary electrode AUX1 and a second auxiliary electrode AUX2. In addition, the auxiliary electrode material layer AUX may be a layer for forming a partial electrode PLT1b of a first capacitor electrode PLT1.

Figure 22C:
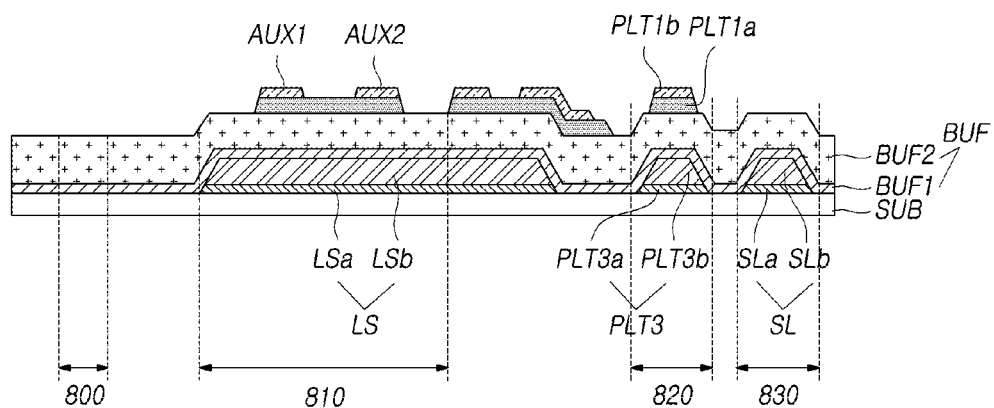

Referring to FIG. 22C, the active layer ACT may be patterned so that a partial electrode PLT1a of the first capacitor electrode PLT1 may be formed.

Referring to FIG. 22C, the auxiliary electrode material layer AUX may be patterned so that the first auxiliary electrode AUX1 and the second auxiliary electrode AUX2 may be formed, and the partial electrode PLT1b of the first capacitor electrode PLT1 may be formed.

Figure 22D:
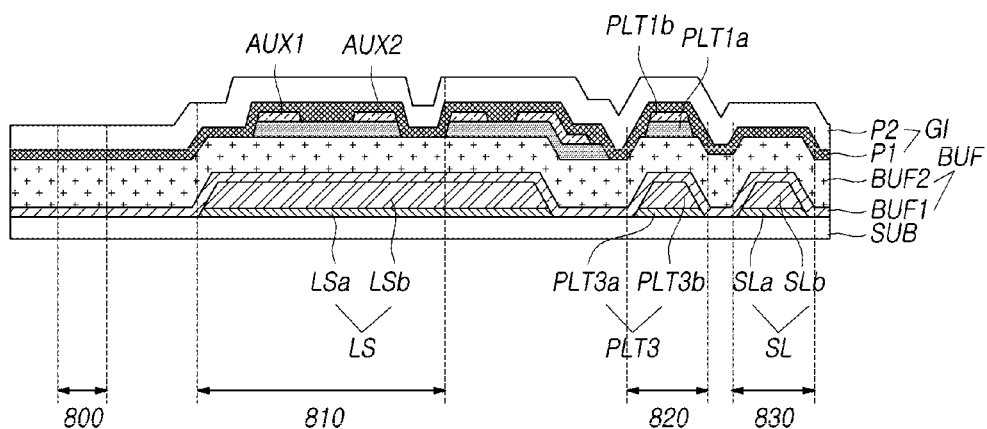

Referring to FIG. 22D, by differentially controlling a flow rate of a deposition gas in two deposition operations (refer to S21 and S22), a first portion P1 of a gate insulating film GI may be formed first, and subsequently, a second portion P2 of the gate insulating film GI may be formed.

The first portion P1 of the gate insulating film GI and the second portion P2 of the gate insulating film GI may commonly include a specific element including at least one first element and at least one second element. A component concentration of the specific element in the first portion P1 of the gate insulating film GI may be different from that of the specific element in the second portion P2 of the gate insulating film GI.

Figure 22E:
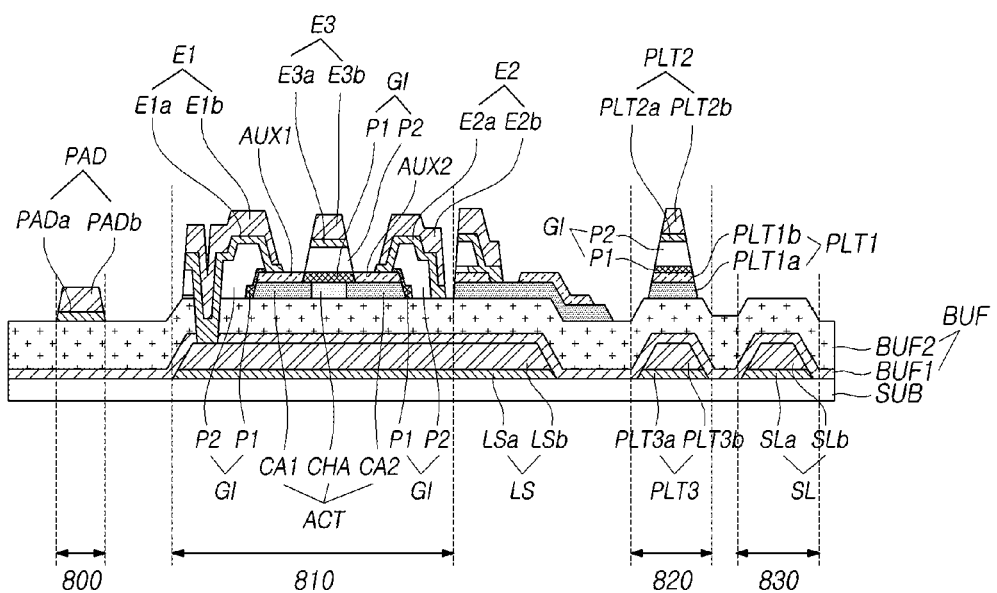

Referring to FIG. 22E, a first electrode E1, a second electrode E2, a third electrode E3, a second capacitor electrode PLT2, and a pad part PAD may be formed. At this point, the gate insulating film GI may be etched.

FIGS. 23A to 23E are cross-sectional views illustrating process operations for manufacturing the display panel 110 in which the transistor TR according to embodiments has a gate insulating film etchless structure. FIGS. 23A to 23E are cross-sectional views illustrating process operations for manufacturing the display panel 110 of FIG. 9.

Figure 23A:
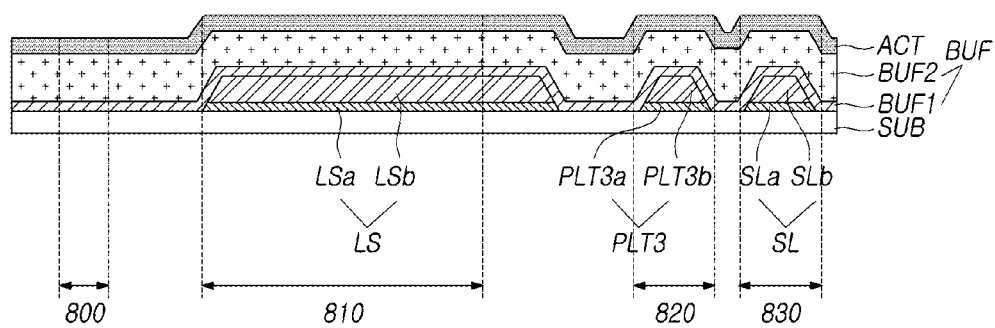
FIGS. 23A to 23E are cross-sectional views illustrating process operations for manufacturing the display panel in which the transistor according to embodiments has a gate insulating film etchless structure.

Referring to FIG. 23A, a light shield LS including a lower light shield LSa and an upper light shield LSb may be formed on a substrate SUB. In this case, a signal line SL may be formed on the substrate SUB using the same material as the light shield LS. In addition, a third capacitor electrode PLT3 may be formed on the substrate SUB using the same material as the light shield LS.

Referring to FIG. 23A, a buffer layer BUF including a first buffer layer BUF1 and a second buffer layer BUF2 may be formed on the substrate SUB while covering the light shield LS, the signal line SL, and the third capacitor electrode PLT3.

Referring to FIG. 23A, an active layer ACT may be formed on the buffer layer BUF. For example, the active layer ACT may include indium gallium zinc oxide (IGZO).

Figure 23B:
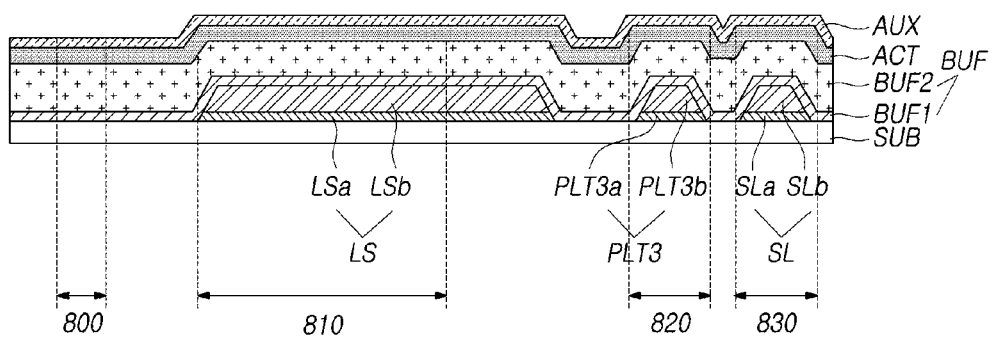

Referring to FIG. 23B, an auxiliary electrode material layer AUX may be formed on the active layer ACT. Here, the auxiliary electrode material layer AUX may be a layer for forming a first auxiliary electrode AUX1 and a second auxiliary electrode AUX2. In addition, the auxiliary electrode material layer AUX may be a layer for forming a partial electrode PLT1b of a first capacitor electrode PLT1.

Figure 23C:
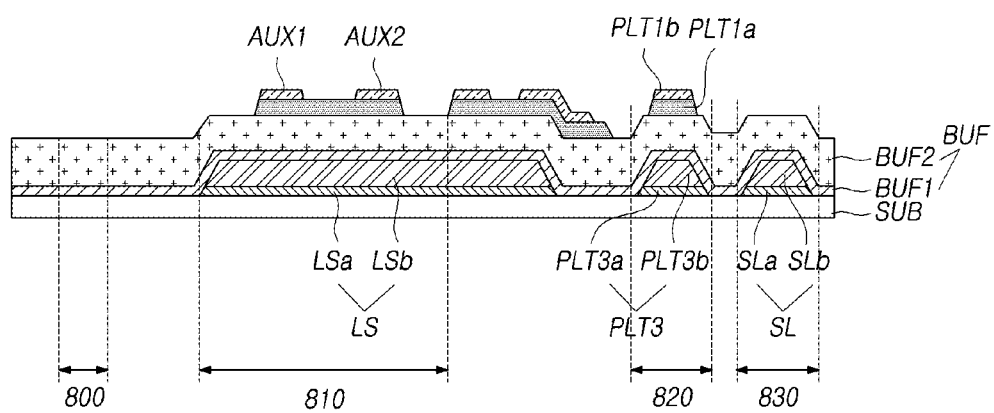

Referring to FIG. 23C, the active layer ACT may be patterned so that a partial electrode PLT1a of the first capacitor electrode PLT1 may be formed.

Referring to FIG. 23C, the auxiliary electrode material layer AUX may be patterned so that the first auxiliary electrode AUX1 and the second auxiliary electrode AUX2 may be formed, and the partial electrode PLT1b of the first capacitor electrode PLT1 may be formed.

Figure 23D:
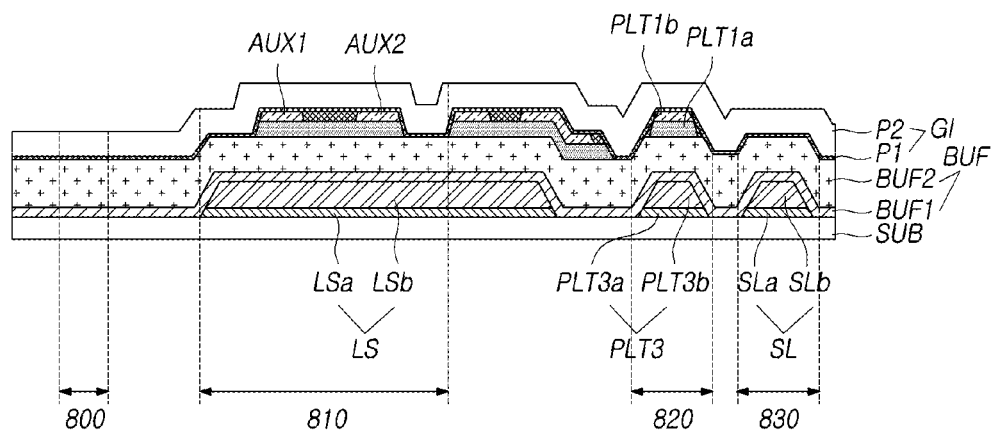

Referring to FIG. 23D, by differentially controlling a flow rate of a deposition gas in two deposition operations (refer to S21 and S22), a first portion P1 of a gate insulating film GI may be formed first, and subsequently, a second portion P2 of the gate insulating film GI may be formed.

The first portion P1 of the gate insulating film GI and the second portion P2 of the gate insulating film GI may commonly include a specific element including at least one first element and at least one second element. A component concentration of the specific element in the first portion P1 of the gate insulating film GI may be different from that of the specific element in the second portion P2 of the gate insulating film GI.

Figure 23E:
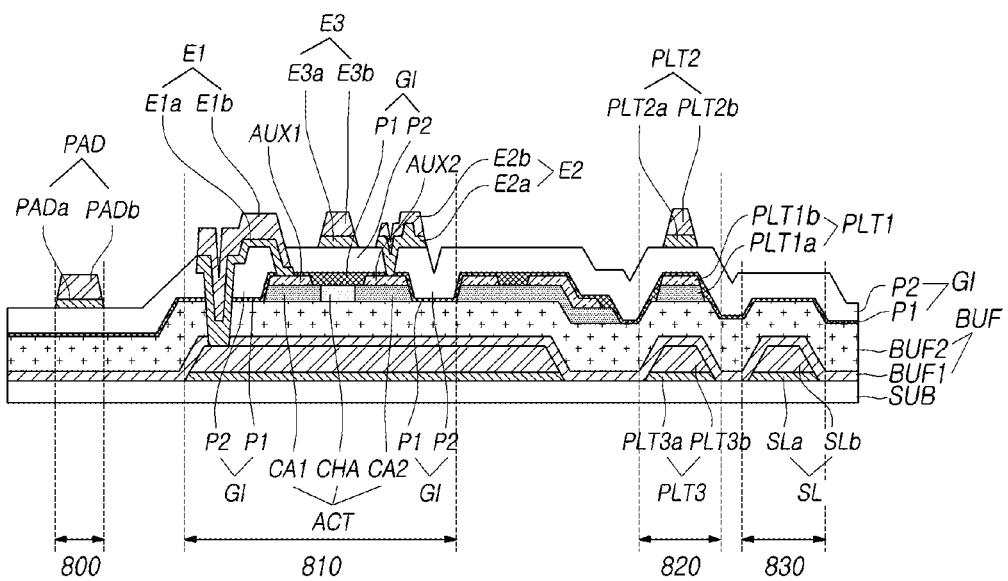

Referring to FIG. 23E, a first electrode E1, a second electrode E2, a third electrode E3, a second capacitor electrode PLT2, and a pad part PAD may be formed. At this point, the gate insulating film GI is not etched.

Figure 24:
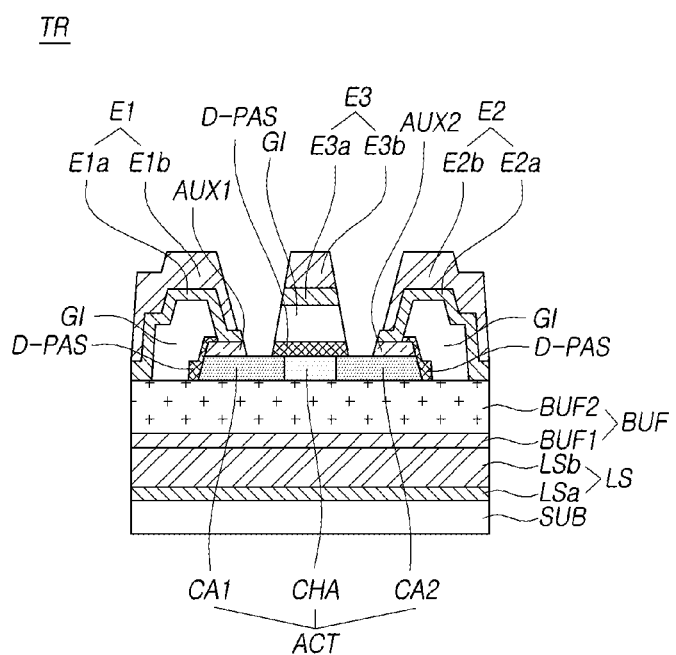
FIGS. 24 and 25 are cross-sectional views each illustrating a structure of the transistor according to embodiments.
Figure 25:
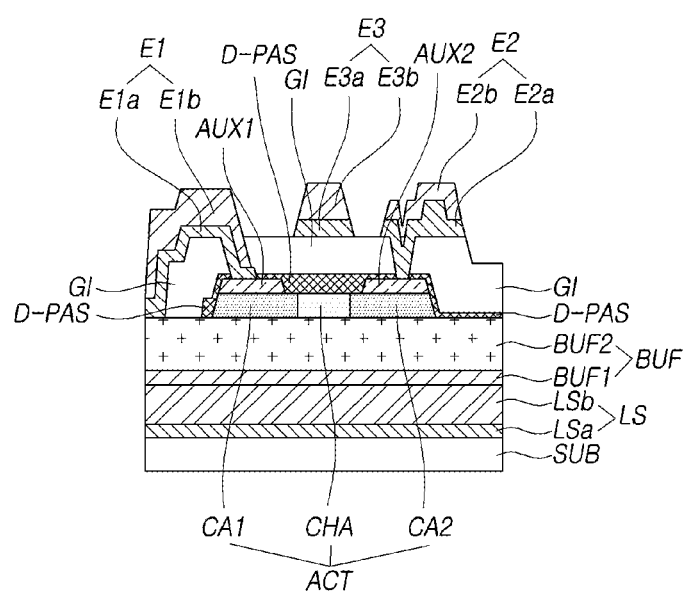

FIGS. 24 and 25 are cross-sectional views each illustrating a structure of the transistor TR according to embodiments. FIG. 24 illustrates a case in which the transistor TR has a gate insulating film etch structure, and FIG. 25 illustrates a case in which the transistor TR has a gate insulating film etchless structure.

Referring to FIGS. 24 and 25, a display device 100 according to embodiments may include a substrate SUB, a buffer layer BUF disposed on the substrate SUB, an active layer ACT disposed on the buffer layer BUF, a gate insulating film GI disposed on the active layer ACT, a third electrode E3 disposed on the gate insulating film GI, and a protective film D-PAS disposed between the gate insulating film GI and the third electrode E3.

The protective film D-PAS of FIGS. 24 and 25 may correspond to the first portion P1 of the gate insulating film GI of FIG. 5, and the gate insulating film GI of FIGS. 24 and 25 may correspond to the second portion P2 of the gate insulating film GI of FIG. 5. Except for these points, the cross-sectional views of FIGS. 24 and 25 are substantially equal to the cross-sectional views of FIGS. 5 and 6. Accordingly, in the following description, differences from FIGS. 5 and 6 will be mainly described in brief.

Referring to FIGS. 24 and 25, the gate insulating film GI and the protective film D-PAS may commonly include two or more specific elements having different component concentrations in the gate insulating film GI and the protective film D-PAS.

The two or more specific elements may include at least one of hydrogen and oxygen and at least one of silicon and nitrogen.

Hydrogen (H) may be included as the first element in the two or more specific elements. In this case, a component concentration of the hydrogen (H) in the protective film D-PAS may be higher than that of the hydrogen (H) in the gate insulating film GI. Here, when the component concentration of the hydrogen (H) increases, the positive degradation may be improved.

Oxygen (O) may be included as the first element in the two or more specific elements. In this case, a component concentration of the oxygen (O) in the protective film D-PAS may be lower than that of the oxygen (O) in the gate insulating film GI. Here, when the component concentration of the oxygen (O) decreases, the positive degradation may be improved.

Silicon (Si) may be included as the second element in the two or more specific elements. In this case, a component concentration of the silicon (Si) in the protective film D-PAS may be higher than that of the silicon (Si) in the gate insulating film GI. Here, when the component concentration of the silicon (Si) increases, the negative degradation may be improved.

Nitrogen (N) may be included as the second element in the two or more specific elements. In this case, a component concentration of the nitrogen (N) in the protective film D-PAS may be higher than that of the nitrogen (N) in the gate insulating film GI. Here, when the component concentration of the nitrogen (N) increases, the negative degradation may be improved.

For example, the thickness of the protective film D-PAS may be included in the range of 20 to 300 Å, in some embodiments 25 to 280 Å, in some embodiments 30 to 270 Å, or in some embodiments 34 to 265 Å. If the thickness of the first portion P1 is included in these ranges, it is possible to obtain the effect of preventing the generation of an instantaneous afterimage and improving both the deterioration of the transistor in both directions.

However, when the thickness of the protective film D-PAS is in the range of 96 to 265 Å, a negative change with respect to the threshold voltage of the transistor may be induced. Therefore, when suppression of the negative change of the threshold voltage of the transistor is more strongly required, the thickness of the protective film D-PAS may in some embodiments be included in the range of 20 to 100 Å, in some embodiments 25 to 96 Å, in some embodiments 30 to 96 Å, or in some embodiments 34 to 95 Å.

The above-described embodiments will be briefly described below.

A display device according to embodiments may include a substrate, a buffer layer disposed on the substrate, an active layer disposed on the buffer layer, a gate insulating film disposed on the active layer, and a gate electrode disposed on the gate insulating film.

The gate insulating film may include a first portion and a second portion, wherein the first portion may be closer to the active layer than the second portion, and the second portion may be closer to the gate electrode than the first portion.

The gate insulating film may include two or more elements having different component concentrations in the first portion and the second portion.

A thickness of the first portion of the gate insulating film may be less than a thickness of the second portion of the gate insulating film.

The two or more elements may include at least one of hydrogen and oxygen and at least one of silicon and nitrogen.

When hydrogen is included in the two or more elements, a component concentration of the hydrogen in the first portion may be higher than a component concentration of the hydrogen in the second portion.

When oxygen is included in the two or more elements, a component concentration of the oxygen in the first portion may be lower than a component concentration of the oxygen in the second portion.

When silicon is included in the two or more elements, a component concentration of the silicon in the first portion may be higher than a component concentration of the silicon in the second portion.

When nitrogen is included in the two or more elements, a component concentration of the nitrogen in the first portion may be higher than a component concentration of the nitrogen in the second portion.

The active layer may include a channel area overlapping the gate electrode, a first conductive area located on one side of the channel area, and a second conductive area located on the other side of the channel area.

The display device according to embodiments may further include a first electrode electrically connected to the first conductive area and a second electrode electrically connected to the second conductive area.

The display device according to embodiments may further include a first auxiliary electrode disposed between the first conductive area and the first electrode and a second auxiliary electrode disposed between the second conductive area and the second electrode.

Each of the first auxiliary electrode and the second auxiliary electrode may include a metal included in the gate electrode or may include a conductive oxide.

The gate insulating film may not be disposed between the first electrode and the gate electrode. Alternatively, the gate insulating film may be disposed between the first electrode and the gate electrode.

The display device according to embodiments may further include a first capacitor electrode and a second capacitor electrode overlapping the first capacitor electrode. The first portion and the second portion of the gate insulating film may be located between the first capacitor electrode and the second capacitor electrode.

The display device according to embodiments may further include a third capacitor electrode. The buffer layer may be located between the first capacitor electrode and the third capacitor electrode.

The display device according to embodiments may further include a light shield located between the substrate and the buffer layer and overlapping the active layer.

The third capacitor electrode may be an electrode from which the light shield is extended, an electrode electrically connected to the light shield, or an electrode including the same metal as a metal included in the light shield.

The first capacitor electrode may be an electrode made conductive with the same semiconductor material as a semiconductor material included in the active layer.

The second capacitor electrode may be an electrode from which the gate electrode is extended, an electrode electrically connected to the gate electrode, or an electrode including the same metal as the gate electrode.

The active layer may include an oxide semiconductor material.

The display device according to embodiments may further include a pad part disposed in a pad area in a non-display area, and a signal line for signal transmission.

The first portion and the second portion of the gate insulating film may extend below the pad part. The first portion and the second portion of the gate insulating film may extend above the signal line.

A display device according to embodiments may include a substrate, a buffer layer disposed on the substrate, an active layer disposed on the buffer layer, a gate insulating film disposed on the active layer, a gate electrode disposed on the gate insulating film, and a protective film disposed between the gate insulating film and the gate electrode.

The gate insulating film and the protective film may commonly include two or more elements having different component concentrations in the gate insulating film and the protective film.

The two or more elements may include at least one of hydrogen and oxygen and at least one of silicon and nitrogen.

A manufacturing method of a display device according to embodiments may include forming an active layer on a substrate, forming a gate insulating film including a first portion and a second portion by depositing an insulating material on the active layer with a deposition gas, and forming a gate electrode on the gate insulating film.

The forming of the gate insulating film may include a first operation of forming the first portion by depositing the insulating material on the active layer with the deposition gas having a first flow rate, and a second operation of forming the second portion by depositing the insulating material on the first portion with the deposition gas having a second flow rate lower than the first flow rate.

The first operation may be performed for a shorter time than the second operation.

A thickness of the first portion of the gate insulating film formed in the first operation may get thicker as a time in which the first operation is performed increases.

The thickness of the first portion may be less than a thickness of the second portion.

The first portion may be closer to the active layer than the second portion, the second portion may be closer to the gate electrode than the first portion, and the gate insulating film may include two or more elements having different component concentrations in the first portion and the second portion.

The two or more elements may include at least one of hydrogen and oxygen and at least one of silicon and nitrogen.

The deposition gas may include silane ($SiH_4$).

According to the embodiments described above, it is possible to provide a display device having a transistor structure which can improve both degradations of a transistor in positive and negative directions, and a manufacturing method thereof.

According to embodiments, it is possible to provide a display device having a transistor structure which can prevent an instantaneous afterimage, and a manufacturing method thereof.

According to embodiments, it is possible to provide a display device including a gate insulating film having a structure which can remove a trap generated at an interface between an active layer and the gate insulating film, and a manufacturing method thereof.

The above description has been presented to enable any person skilled in the art to make and use the technical idea of the present disclosure and has been provided in the context of an example application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown but is to be accorded the widest scope consistent with the embodiments illustrated herein. The scope of protection of the present disclosure should be construed based on the following claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
a substrate;
an active layer disposed on the substrate;
a gate insulating film disposed on the active layer; and
a gate electrode disposed on the gate insulating film,
wherein the gate insulating film includes a first portion and a second portion,
wherein the first portion is closer to the active layer than the second portion, and the second portion is closer to the gate electrode than the first portion, and
the gate insulating film includes two or more elements, each of the two or more elements having different component concentrations in one or more of mass or volume in the first portion and the second portion,
wherein the two or more elements include a first element of hydrogen and a second element of one or more of silicon or nitrogen, the first portion having a greater component concentration of the first element of hydrogen than the second portion, and the first portion having a greater component concentration of the second element of one or more of silicon or nitrogen than the second portion.

2. The display device of claim 1, wherein a thickness of the first portion is less than a thickness of the second portion.

3. The display device of claim 2, wherein the thickness of the first portion is in one of ranges of from 20 to 300 Å, from 25 to 280 Å, from 30 to 270 Å, from 34 to 265 Å, from 20 to 100 Å, from 25 to 96 Å, from 30 to 96 Å, or from 34 to 95 Å.

4. The display device of claim 1, wherein the two or more elements include a first element of oxygen, wherein a component concentration of the oxygen in the first portion is lower than a component concentration of the oxygen in the second portion.

5. The display device of claim 1, wherein the active layer includes a channel area overlapping the gate electrode, a first conductive area located on one side of the channel area, and a second conductive area located on another side of the channel area, and
the display device further includes a first electrode electrically connected to the first conductive area and a second electrode electrically connected to the second conductive area.

6. The display device of claim 5, further comprising:
a first auxiliary electrode disposed between the first conductive area and the first electrode; and
a second auxiliary electrode disposed between the second conductive area and the second electrode,
wherein each of the first auxiliary electrode and the second auxiliary electrode includes a metal which is included in the gate electrode or includes a conductive oxide.

7. The display device of claim 5, wherein the gate insulating film is not disposed between the first electrode and the gate electrode.

8. The display device of claim 5, wherein the gate insulating film is disposed between the first electrode and the gate electrode.

9. The display device of claim 1, further comprising a buffer layer disposed on the substrate, wherein the active layer is disposed on the buffer layer.

10. The display device of claim 1, further comprising:
a pad part disposed in a pad area in a non-display area of the substrate; and
a signal line for signal transmission,
wherein the first portion and the second portion of the gate insulating film extend below the pad part, and
the first portion and the second portion of the gate insulating film extend above the signal line.

11. A display device, comprising:
a substrate;
a buffer layer disposed on the substrate;
an active layer disposed on the buffer layer;
a gate insulating film disposed on the active layer; and
a gate electrode disposed on the gate insulating film; and
a first capacitor electrode and a second capacitor electrode overlapping the first capacitor electrode,
wherein the gate insulating film includes a first portion and a second portion,
wherein the first portion is closer to the active layer than the second portion, and the second portion is closer to the gate electrode than the first portion, and the gate insulating film includes two or more elements, each of the two or more elements having different component concentrations in the first portion and the second portion;
wherein the first portion and the second portion of the gate insulating film are located between the first capacitor electrode and the second capacitor electrode,
wherein:
the display device further comprises a third capacitor electrode, and
wherein the buffer layer is disposed between the first capacitor electrode and the third capacitor electrode,
wherein:
the display device further comprises a light shield located between the substrate and the buffer layer and overlapping the active layer,
wherein the third capacitor electrode is an electrode from which the light shield is extended, an electrode electrically connected to the light shield, or an electrode including a same metal as a metal included in the light shield,
the first capacitor electrode is a layer including a same semiconductor material as a semiconductor material included in the active layer, and
the second capacitor electrode is an electrode from which the first electrode, the second electrode, or the gate electrode is extended; an electrode electrically connected to the first electrode, the second electrode, or the gate electrode; or an electrode including a same metal as the first electrode, the second electrode, or the gate electrode.

12. A manufacturing method of a display device, the method comprising:
forming an active layer on a substrate;
forming a gate insulating film including a first portion and a second portion by depositing an insulating material on the active layer with a deposition gas; and
forming a gate electrode on the gate insulating film,
wherein the forming of the gate insulating film includes:
a first operation of forming the first portion by depositing the insulating material on the active layer with the deposition gas having a first flow rate; and
a second operation of forming the second portion by depositing the insulating material on the first portion with the deposition gas having a second flow rate lower than the first flow rate; and
wherein the first portion and the second portion each including a first element of hydrogen and a second element of one or more of silicon or nitrogen, the first portion having a greater component concentration of the first element of hydrogen than the second portion, and the first portion having a greater component concentration of the second element than the second portion.

13. The method of claim 12, wherein the first operation is performed for a shorter time than the second operation.

14. The method of claim 12, wherein a thickness of the first portion of the gate insulating film formed in the first operation increases as a duration of the first operation increases.

15. The method of claim 12, wherein the forming of the gate insulating film further includes:
controlling a thickness of the first portion of the gate insulating film by controlling a duration of the first operation.

16. The method of claim 12, wherein the deposition gas includes silane ($SiH_4$).

17. A display device comprising:
a substrate;
an active layer disposed on the substrate;
a gate insulating film disposed on the active layer; and
a gate electrode disposed on the gate insulating film,
wherein the gate insulating film includes a first portion and a second portion,
wherein the first portion is closer to the active layer than the second portion, and the second portion is closer to the gate electrode than the first portion,
the gate insulating film includes two or more elements, each of the two or more elements having different component concentrations in one or more of mass or volume in the first portion and the second portion, and
the two or more elements include a first element of oxygen and a second element of one or more of silicon or nitrogen, the first portion having a smaller component concentration of the first element of oxygen than the second portion, and the first portion having a greater component concentration of the second element of one or more of silicon or nitrogen than the second portion.

18. The display device of claim 17, wherein the two or more elements include a first element of hydrogen, wherein a component concentration of the hydrogen in the first portion is higher than a component concentration of the hydrogen in the second portion.

19. The display device of claim 17, wherein the active layer includes a channel area overlapping the gate electrode, a first conductive area located on one side of the channel area, and a second conductive area located on another side of the channel area, and
the display device further includes a first electrode electrically connected to the first conductive area and a second electrode electrically connected to the second conductive area.

20. The display device of claim 19, further comprising:
a first auxiliary electrode disposed between the first conductive area and the first electrode; and
a second auxiliary electrode disposed between the second conductive area and the second electrode, wherein each of the first auxiliary electrode and the second auxiliary electrode includes a metal which is included in the gate electrode or includes a conductive oxide.

* * * * *